United States Patent
Boyd et al.

(10) Patent No.: US 12,543,297 B2
(45) Date of Patent: Feb. 3, 2026

(54) HEAT EXCHANGER

(71) Applicant: VALEO SYSTEMES THERMIQUES, La Verriere (FR)

(72) Inventors: Henry Boyd, Auburn Hills, MI (US); David Troy, Auburn Hills, MI (US); Allen Skowron, Troy, MI (US)

(73) Assignee: Valeo Systemes Thermiques, La Verriere (FR)

( * ) Notice: Subject to any disclaimer, the term of this patent is extended or adjusted under 35 U.S.C. 154(b) by 236 days.

(21) Appl. No.: 18/539,426

(22) Filed: Dec. 14, 2023

(65) Prior Publication Data

US 2025/0203825 A1 Jun. 19, 2025

(51) Int. Cl.
*H05K 7/20* (2006.01)

(52) U.S. Cl.
CPC ................................ *H05K 7/20854* (2013.01)

(58) Field of Classification Search
CPC ............ H05K 7/20854; H05K 7/20254; F28D 2021/0028; F28F 3/025; F28F 2275/025; F28F 3/12
USPC ......................................................... 165/80.4
See application file for complete search history.

(56) References Cited

U.S. PATENT DOCUMENTS

| | | | | |
|---|---|---|---|---|
| 7,252,139 B2* | 8/2007 | Novotny | .................. | F25D 19/00 |
| | | | | 257/E23.098 |
| 9,860,987 B2* | 1/2018 | Singh | ...................... | H05K 1/111 |
| 10,383,261 B2* | 8/2019 | Krivonak | ............ | H05K 7/20927 |
| 10,770,373 B2* | 9/2020 | Tamura | ...................... | F28F 3/06 |
| 2009/0296345 A1* | 12/2009 | Nguyen | ...................... | F28F 3/12 |
| | | | | 361/689 |
| 2012/0087088 A1* | 4/2012 | Killion | ...................... | F28F 3/12 |
| | | | | 165/104.25 |
| 2022/0418154 A1* | 12/2022 | Chen | .................. | H05K 7/20772 |
| 2023/0397376 A1* | 12/2023 | Heydari | ............ | H05K 7/20509 |
| 2024/0314980 A1 | 9/2024 | Nasr et al. | | |

FOREIGN PATENT DOCUMENTS

| | | |
|---|---|---|
| CN | 116965163 A | 10/2023 |
| FR | 3100608 A1 | 3/2021 |

OTHER PUBLICATIONS

European Patent Office, International Search Report and Written Opinion of corresponding International Application No. PCT/US2024/059346, dated Mar. 27, 2025, 7 pages.

* cited by examiner

*Primary Examiner* — Steve S Tanenbaum
(74) *Attorney, Agent, or Firm* — Valeo Systemes Thermiques

(57) ABSTRACT

A heat exchanger assembly: a heat exchanger with a first tube including a first flat plate and a first shaped plate connected to each other to form a first tube channel extending along a first tube extension axis. The first shaped plate includes a stamped depression forming together with the surface of the first flat plate the first tube channel. The heat exchanger assembly further includes a chassis to which the heat exchanger is attached, with the chassis including a housing. The first tube is located externally with respect to the housing. The housing has a primary slot in which the first tube is at least partially enveloped, with the first tube facing the primary slot with the first shaped plate. The first tube is connected to the primary slot by an adhesive.

20 Claims, 21 Drawing Sheets

HEAT EXCHANGER

TECHNICAL FIELD

The invention relates to a heat exchanger, in particular for an electronic control unit, applicable in automotive field.

BACKGROUND OF THE INVENTION

Electronic control units are known to require thermal management. Integrated circuits, or other electronic or electric components, generate heat during operation. In case of integrated circuits, the power is dissipated on a small surface. The heat generated this way needs to be effectively evacuated, especially when the components operate under high loads. High performance units require dedicated cooling devices to enable their effective operation. One known way of addressing the issue is to utilize air for direct cooling of the heat sources.

Automotive industry increasingly depends on high performance electronic control units to ensure safe and effective operation of vehicles. More and more of electronic control units, in various forms and configurations, are utilized to perform functions such as controlling the vehicle's battery systems, handling the driver assistance systems or performing autonomous driving function.

There is a need to provide an effective heat exchange solution, which could be used for thermal management of an electronic control unit, in particular one used in a vehicle.

SUMMARY OF THE INVENTION

An object of the invention is a heat exchanger assembly comprising: a heat exchanger with a first tube including a first flat plate and a first shaped plate connected to each other to form a first tube channel extending along a first tube extension axis, wherein the first shaped plate includes a stamped depression forming together with a surface of the first flat plate the first tube channel, a chassis to which the heat exchanger is attached, the chassis including a housing, wherein the first tube is located externally with respect to the housing, wherein the housing has a primary slot in which the first tube is at least partially enveloped, with the first tube facing the primary slot with the first shaped plate, wherein the first tube is connected to the primary slot by an adhesive.

In one example, the adhesive fills, in a binding manner, at least portion of space formed between the primary slot and an unstamped portion of the first shaped plate.

In one example, the adhesive fills, in a binding manner, all the space formed between the primary slot and an unstamped portion of the first shaped plate.

In one example, the stamped depression is at least partly in contact with the primary slot.

In one example, the stamped depression is separated from the primary slot by the adhesive.

In one example, the primary slot includes a first rib protruding from the primary slot towards the first tube within an unstamped portion of the first shaped plate.

In one example, the primary slot includes a primary separation wall, the primary separation wall having an outline corresponding to an outline of the first tube.

In one example, the adhesive is adapted to have high temperature conductivity.

In one example, the first rib touches the first tube.

In one example, the first rib is connected to the first tube by the adhesive.

In one example, the first tube channel forms a first primary arm and a second primary arm extending parallel to each other along the first tube extension axis, wherein the first primary arm is at least partly separated from the second primary arm by a first primary wall, the first primary wall being an unstamped portion of the first shaped plate between the first primary arm and the second primary arm and thereby creating a first primary spacing.

In one example, the adhesive fills the first primary spacing.

In one example, the heat exchanger includes a second tube including a second flat plate and a second shaped plate connected to each other to form a second tube channel extending along a second tube extension axis, wherein the second shaped plate includes another stamped depression forming together with a surface of the second flat plate the second tube channel, wherein the second tube is located externally with respect to the housing, wherein the housing has a secondary slot in which the second tube is at least partially enveloped, with the second tube facing the secondary slot with the second shaped plate, wherein the second tube is connected to the secondary slot by an adhesive.

In one example, the adhesive fills, in a binding manner, at least portion of space formed between the secondary slot and an unstamped portion of the second shaped plate.

In one example, the adhesive fills, in a binding manner, all the space formed between the secondary slot and an unstamped portion of the second shaped plate.

In one example, the stamped depression of the second tube is at least partly in contact with the secondary slot.

In one example, the stamped depression of the second tube is separated from the secondary slot by the adhesive.

In one example, the secondary slot includes a second rib protruding from the secondary slot towards the second tube within the unstamped portion of the second shaped plate.

In one example, the second rib touches the second tube.

In one example, the second rib is connected to the second tube by the adhesive.

BRIEF DESCRIPTION OF DRAWINGS

The present invention will be described in greater detail below with reference to the drawings. In the drawings.

DETAILED DESCRIPTION OF THE INVENTION

Figure 1:
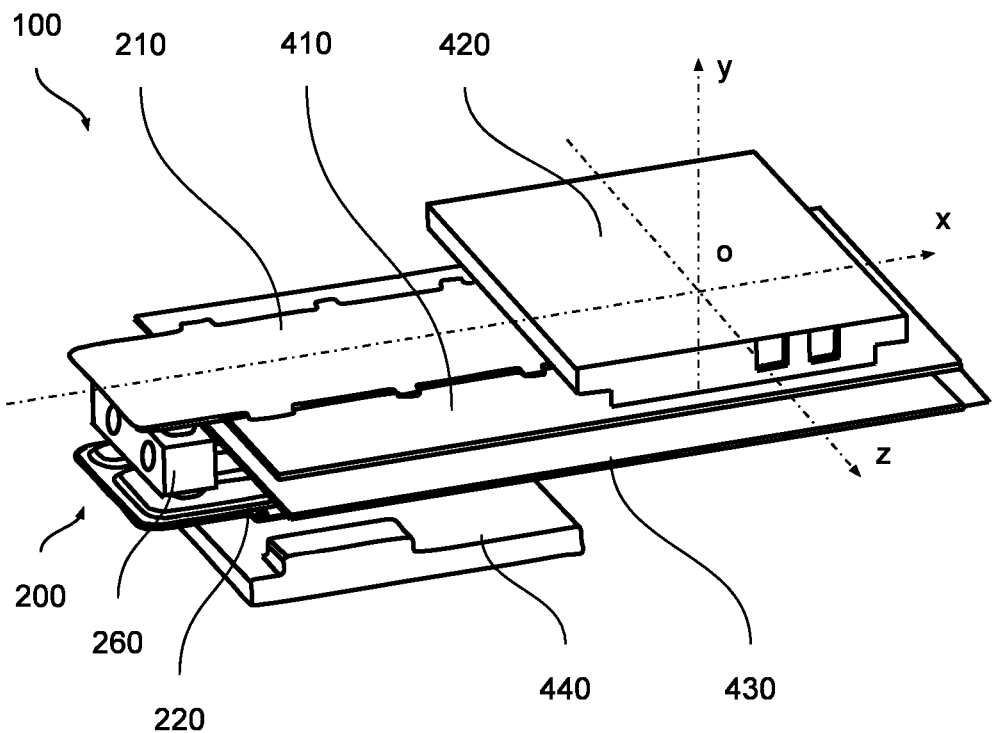
FIG. 1 shows a heat exchanger assembly with heat source modules in a perspective view.
Figure 2:
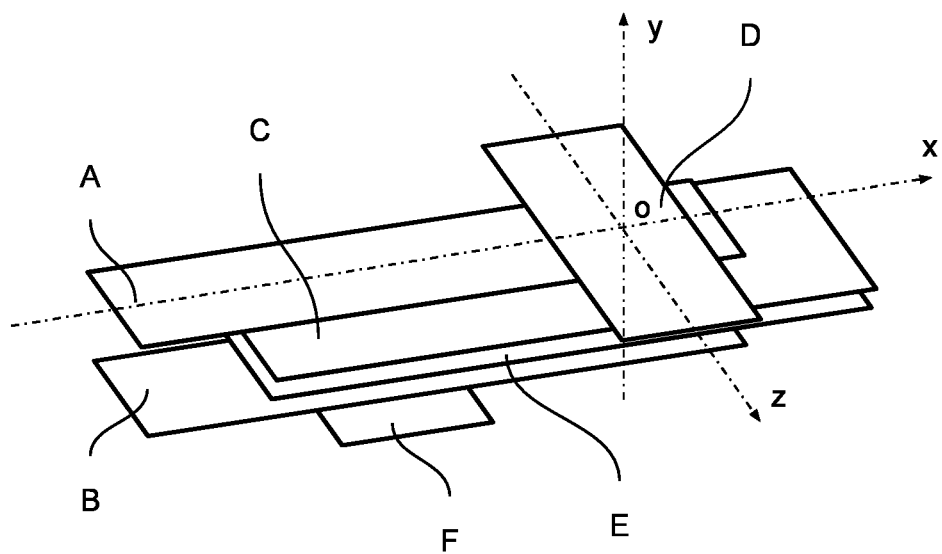
FIG. 2 shows schematically extension planes of select heat exchanger assembly components.

In order to simplify the description of the invention, a Cartesian reference is formed (o, x, y, z), and the direction o-x is defined as being the direction of the length, o-y is the direction of the height, and o-z is the direction of the width, as shown in FIGS. 1 and 2.

FIG. 1 shows a heat exchanger assembly 100 with a heat exchanger 200 and a plurality of heat source modules 410, 420, 430, 440 in a perspective view. The heat exchanger 200 includes a first tube 210 for a heat exchange fluid. The heat exchange fluid flows through the heat exchanger 200, in particular through the first tube 210, and enables heat exchange between the heat exchanger 200 and any heat sources in contact with it. The heat exchange fluid can be a refrigerant (such as R134A, R-1234YF or R744) or a coolant (e.g. glycol-water mixture).

The heat exchanger 200 can further include a second tube 220 for a heat exchange fluid, connected fluidically to the first tube 210. The first tube 210 and the second tube 220 can be connected by one or more interconnectors 260 enabling fluid flow therebetween.

The heat exchanger assembly 100 includes at least a first heat source module 410. In the embodiment shown in FIG. 1, the heat exchanger assembly 100 includes the first heat source module 410, a second heat source module 420, a third heat source module 430 and a fourth heat source module 440.

The first heat source module 410 abuts the first tube 210, so that heat from the first heat source module 410 can be dissipated to the first tube 210.

In the shown embodiment, the first and second heat source modules 410, 420 abut the first tube 210. The second tube 220 is abutted by the third and fourth heat source modules 430, 440. In other words, the first tube 210 is sandwiched between the first and second heat source modules 410, 420, while the second tube 220 is sandwiched between the third heat source module 430 and the fourth heat source module 440. By the term "sandwiched" it is meant that the first tube 210 and second tube 220 are in contact with and are located between respective heat source modules, taking into account presence of any thermal paste that could be used between their surfaces to improve heat exchange.

FIG. 2 shows schematically examples of extension planes of select components of the heat exchanger assembly 100. The first tube 210 extends within a first tube extension plane A. The second tube 220 extends within a second tube extension plane B. The first heat source module 410 extends within a first heat source module extension plane C. The second heat source module 420 extends within a second heat source module extension plane D. The third heat source module 430 extends within a third heat source module extension plane E. The fourth heat source module 440 extends within a fourth heat source module extension plane F. By "extension within an extension plane", it is meant here that two dimensions of the three-dimensional component are significantly greater than the third dimension, where the two dimensions are measured within said extension plane. The third dimension is measured perpendicular to the extension plane. In other words, a component extending within an extension plane is a generally flat component, the height of which is relatively small compared to its width and length. Preferably, all extension planes A, B, C, D, E and F extend in parallel to each other.

In the shown embodiment, the first tube 210 and the second tube 220 extend predominantly along axis X and to a lesser degree along axis Z, meaning their length is greater than their width. Their height is substantially smaller than the two other dimensions.

The first heat source module 410 and the third heat source module 430 similarly extend predominantly along axis X and to a lesser degree along axis Z, meaning their length is greater than their width. Their height is substantially smaller than the two other dimensions.

The second heat source module 420 and the fourth heat source module 440 extend predominantly along axis Z and to a lesser degree along axis X, meaning their width is greater than their length (the opposite arrangement is also envisaged). Their height is substantially smaller than the two other dimensions.

It should be noted that there can be a plurality of the second heat source modules 420 arranged along the first tube 210, as well as a plurality of fourth heat source modules 440 arranged along the second tube 220. Similarly, a plurality of the first heat source modules 410 and the third heat source modules 430 could be arranged along the first and second tubes 210, 220, depending on the configuration of the unit.

Figure 3:
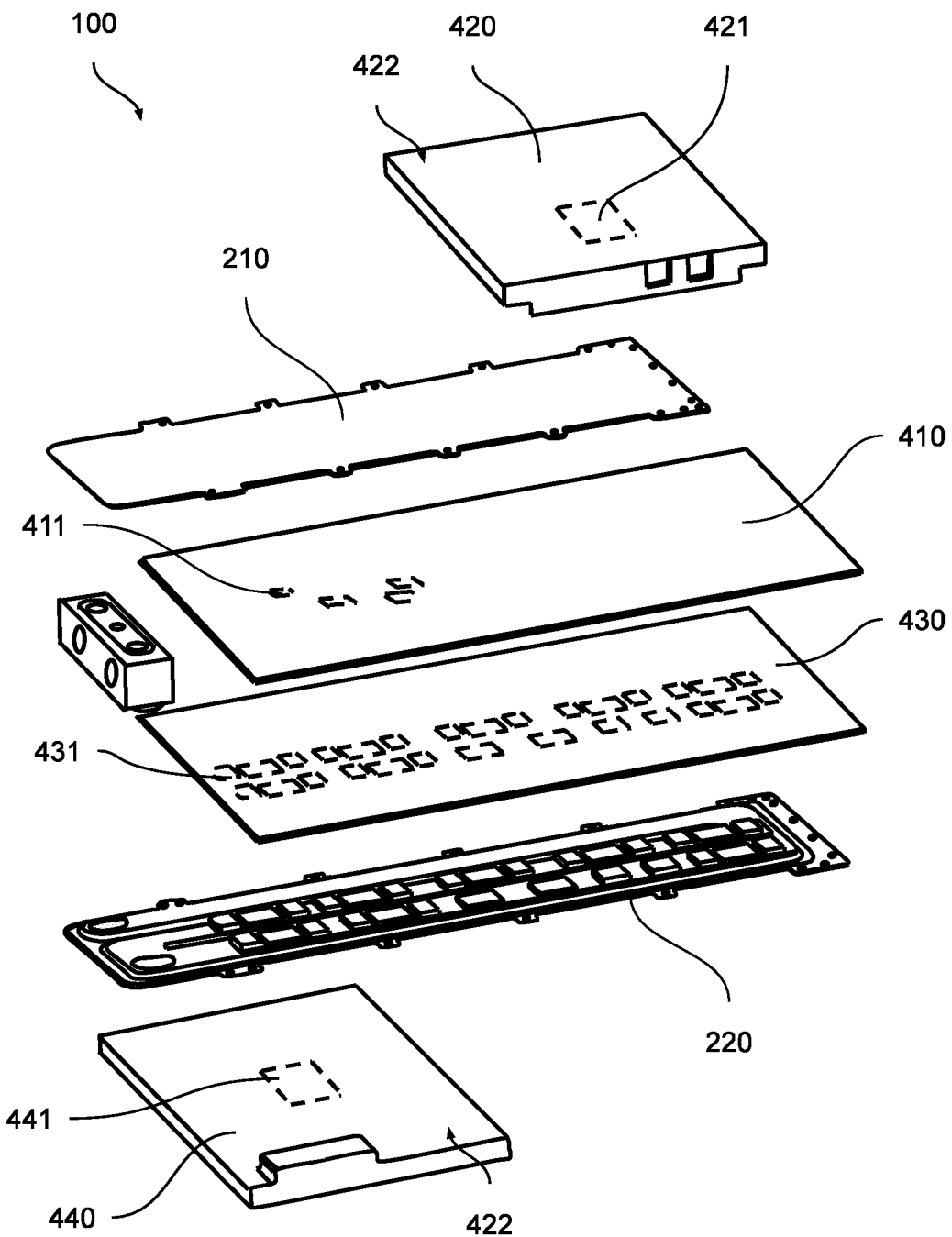
FIG. 3 shows a heat exchanger assembly of FIG. 1 in an exploded view.

FIG. 3 shows a heat exchanger assembly 100 of FIG. 1 in an exploded view. The first heat source module 410 includes at least one first heat source 411. In the shown embodiment, the first heat source module 410 includes a plurality of first heat sources 411. Preferably, the plurality of first heat sources 411 extends parallel to the predominant extension axis of the first tube 210 so that this single first tube 210 can address the heat exchange needs of the whole first heat source module 410. In one embodiment, the first heat source module 410 is a PCB board. The first heat sources 411 can be individual integrated circuits.

The second heat source module 420 includes at least one second heat source 421.

Figure 8:
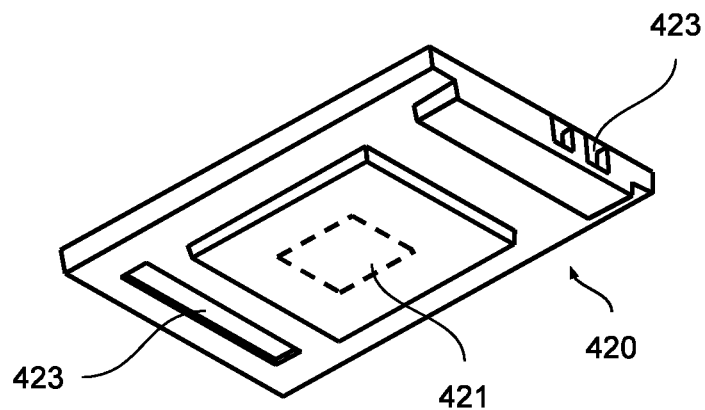
FIG. 8 shows a heat source module in form of a cartridge in a perspective view from the bottom.

In the shown embodiment, the second heat source module 420 is in form of a cartridge 422, as it will be shown in detail in FIG. 8. In one embodiment, the second heat source module 420 is in form of a cartridge 422 in which a PCB board with at least one integrated circuit is located.

The third heat source module 430 includes at least one third heat source 431. In the shown embodiment, the third heat source module 430 includes a plurality of third heat sources 431. Preferably, the plurality of the third heat sources 411 extends parallel to the predominant extension axis of the second tube 220 so that this single second tube 220 can address the heat exchange needs of the whole third heat source module 430. In one embodiment, the third heat source module 430 is a PCB board. The third heat sources 431 can be integrated circuits.

The fourth heat source module 440 includes at least one fourth heat source 441. In one embodiment, the fourth heat source module 440 is in form of a cartridge 422 in which a PCB board with at least one integrated circuit is located.

Figure 4:
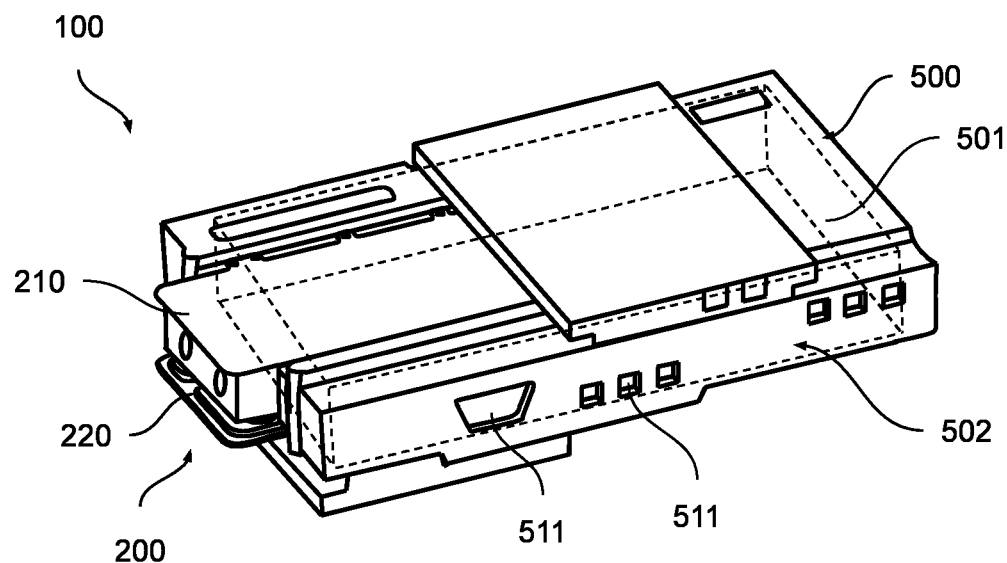
FIG. 4 shows a heat exchanger assembly in a perspective view.
Figure 5:
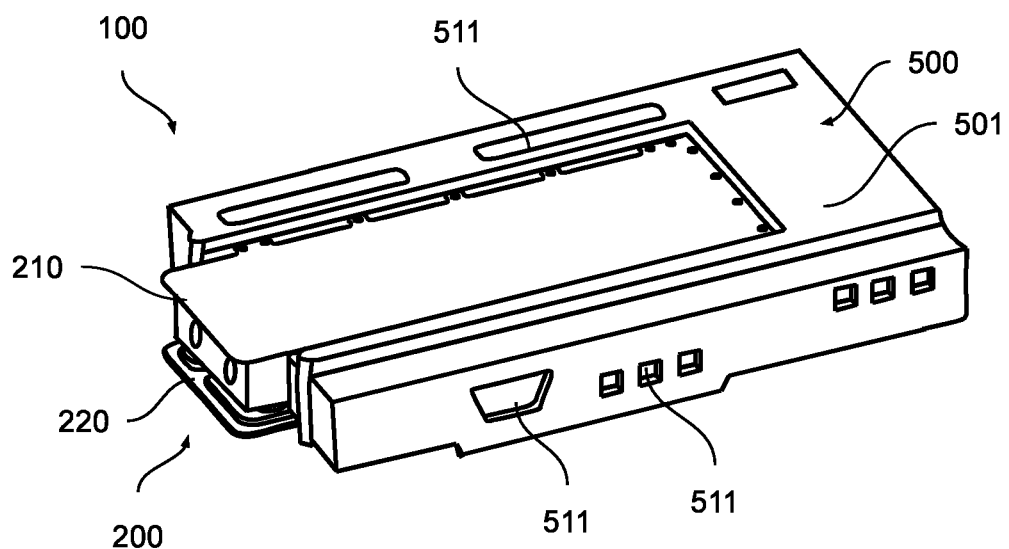
FIG. 5 shows a chassis with a heat exchanger in a perspective view.

FIG. 4 and FIG. 5 respectively show a heat exchanger assembly 100 and a chassis 500 with a heat exchanger 200 in a perspective view. The heat exchanger assembly 100 can include a chassis 500 serving as a mounting point for all the components, as well as enabling integration of the heat exchanger assembly 100 to other structures, such as a dedicated rack or a vehicle structure.

The chassis 500 preferably includes a housing 501, which can define an internal volume 502. The first heat source module 410 can be located within the internal volume 502. Preferably, the third heat source module 430 is also located inside the internal volume 502. The chassis 500 with the housing 501 allows to have the first and third heat source modules 410, 430 in form of PCBs without other protective arrangements, as the housing 501 can be configured to constitute a standalone enclosure protecting the internal components from outside detrimental factors as moisture, debris or moving elements of the vehicle. The housing 501 can include housing apertures 511 enabling connectors (not shown) of the first and third heat source modules 410, 430 to be exposed so that they can be connected to external signal and/or power lines, as well as connection between the second and fourth heat source modules 420, 440 to the components located inside of the housing 501.

In the shown embodiment, the first tube 210 is located externally with respect to the housing 501. The second tube 220 can be located externally with respect to the housing 501 as well. Consequently, any heat source modules external to the housing 501 can also be cooled by the heat exchanger 200 of the heat exchanger assembly 100. In particular, the second heat source module 420 can be attached to the chassis 500 externally with respect to the housing 501. Similarly, the fourth heat source module 440 can be attached to the chassis 500 externally with respect to the housing 501.

Figure 6:
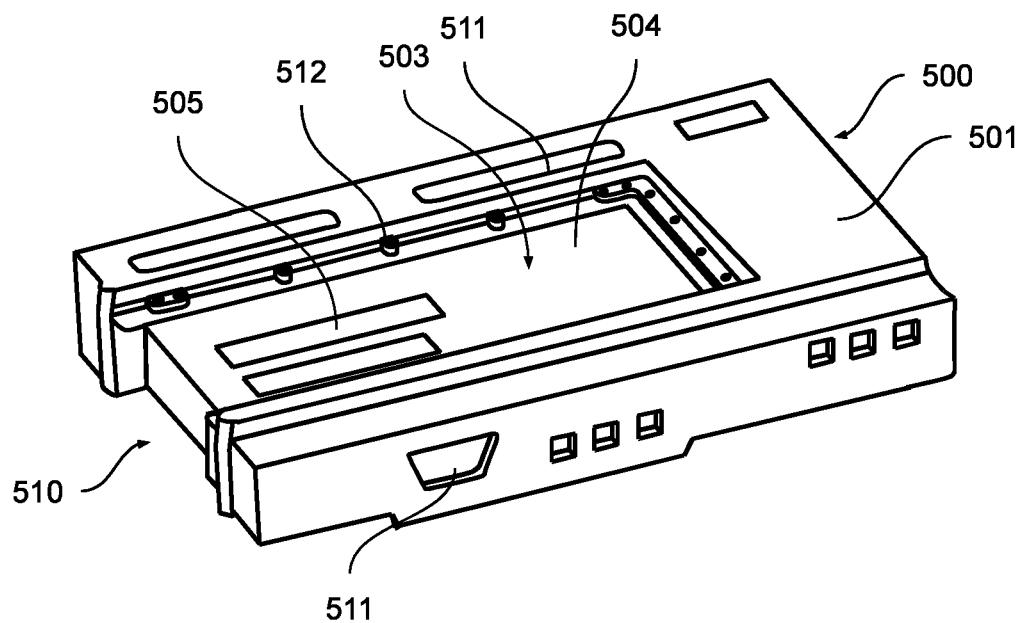
FIG. 6 shows a chassis in a perspective view from above.
Figure 7:
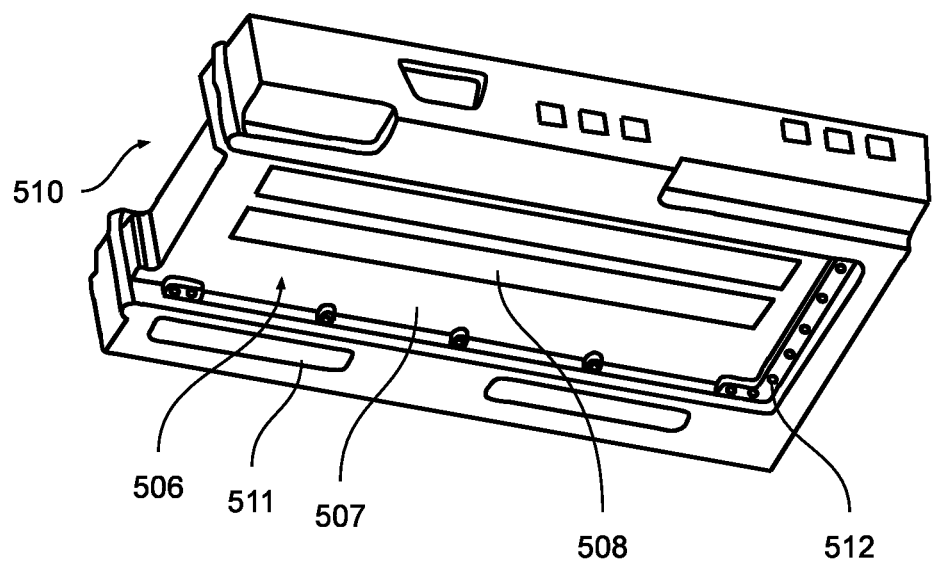
FIG. 7 shows a chassis in a perspective view from below.

FIG. 6 and FIG. 7 respectively show the chassis 500 without the heat exchanger 200 in a perspective view from above and below. The housing 501 of the chassis 500 can include a primary slot 503 for the first tube 210. The primary slot 503 can at least partially envelop the first tube 210. In other words, the primary slot 503 constitutes a depression within the housing 501 in which the first tube 210 can be placed. The top portion of the first tube 210 can thus be flush with the housing 501. The primary slot 503 allows providing a compact assembly, in particular when the second heat source 420 is also attached to the housing 501 of the chassis 500 as shown above.

The housing 501 can have a primary separation wall 504 between the first tube 210 and the first heat source module 410. As explained in detail in relation to further figures, the heat exchanger 200 can include attachments 300 attached to and protruding substantially perpendicularly from the first tube 210 and/or the second tube 220. In such case, the primary separation wall 504 can include at least one primary attachment opening 505 through which such attachment 300 protrudes. In the shown embodiment, there are two attachments 300 placed on the first tube 210. Consequently, there are two primary attachment openings 505 as well. The two primary attachment openings 505 can be of different sizes to accommodate differently sized attachments 300.

In one embodiment, the housing 501 has an interconnector cut-out 510 at least partially enveloping one or more interconnectors 260 extending between the first tube 210 and the second tube 220. In other words, the interconnector cut-out 510 constitutes a depression within the housing 501 in which said one or more interconnectors 260 can be placed. This allows improving compactness of the assembly.

As shown in FIG. 7, the housing 501 can have a secondary slot 506 for the second tube 220, which can at least partially envelope the second tube 220 analogously to the primary slot 503 in relation to the first tube 210.

The housing 501 can have a secondary separation wall 507 between the second tube 220 and the third heat source module 430. The secondary separation wall 507 can include one or more secondary attachment openings 508 through which any attachment 300 of the second tube 220 can protrude. The secondary attachment openings 508 can be of different sizes to accommodate differently sized attachments 300.

Figure 18:
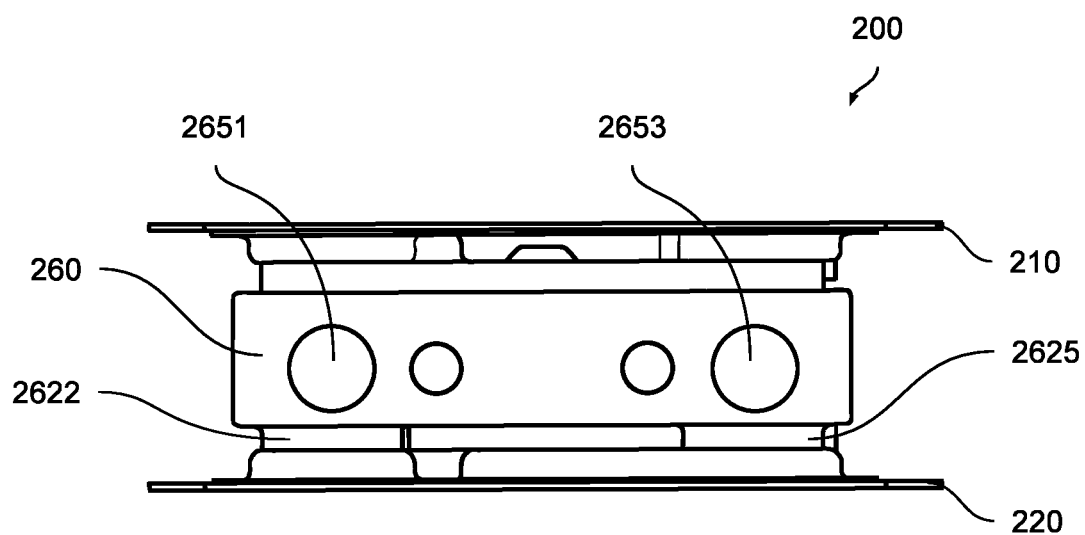
FIG. 18 shows a heat exchanger in a side view.
Figure 19:
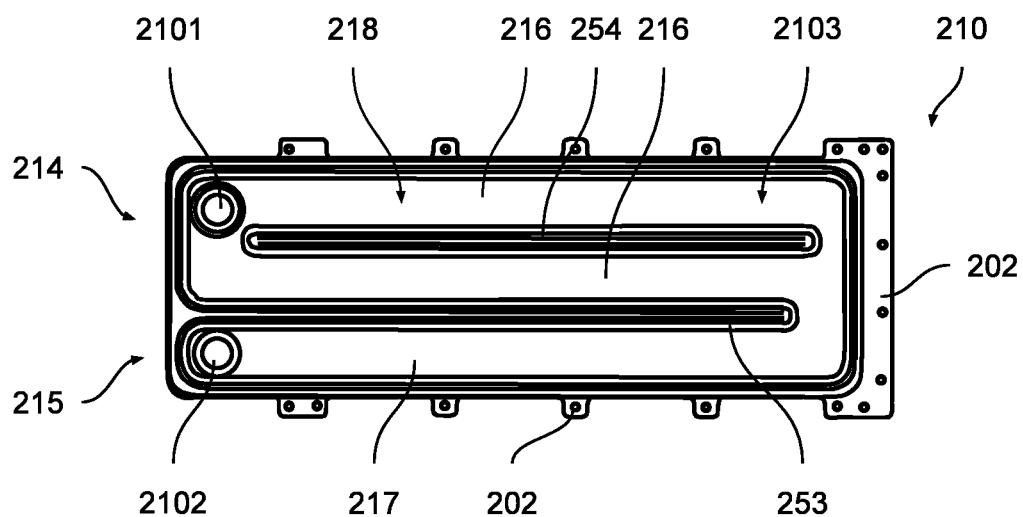
FIG. 19 shows an example of a first tube.

The housing 501 can include housing attachment points 512 to enable direct fixation of the first tube 210 and second tube 220 if needed. For example, the housing attachment points 512 can be in form of a base with opening for a screw, while the first and second tubes 210, 220 can have corresponding tube attachment tabs 202 (as shown in FIGS. 18, 19) with openings as well so that the components can be fixed together by means of screws.

FIG. 8 shows a heat source module, in this case the second heat source module 420, in form of a cartridge 422 in a perspective view from the bottom. The second heat source module 420 includes a second heat source 421, for example a PCB board with one or more integrated circuits. In the shown embodiment, the second heat source module 420 encapsulates the second heat source 421. The cartridge 422 can be a case defining a closed volume inside of which the second heat source 421 is located. Cartridge apertures 423 can be provided to enable connecting the second heat source module 420 to other components of the chassis 500 or external signal or power lines.

Figure 9:
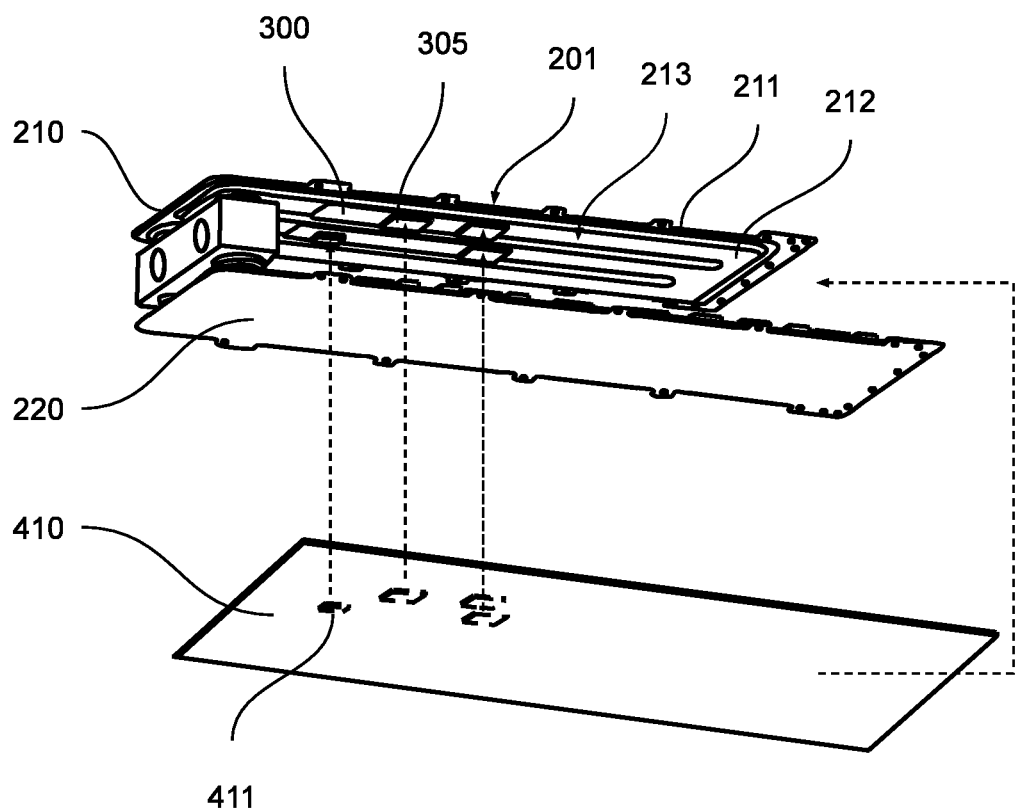
FIG. 9 shows a heat exchanger and a heat source module in an exploded view.

FIG. 9 shows a heat exchanger 200 and a heat source module, in this case the first heat source module 410, in an exploded view from below. The first heat source module 410, with a plurality of the first heat sources 411 is placed between the first tube 210 and the second tube 220, in contact with the first tube 210. The first tube 210 can be made of heat exchange plates 201. In the shown embodiment, the first tube 210 includes a first flat plate 211 (as better seen in FIG. 10) and a first shaped plate 212 connected to each other to form a first tube channel 2103 for the heat exchange fluid. In general, by a flat plate it is meant a plate which is generally flat and contributes to formation of any fluid channel by its flat portion. Since the first tube 210 includes attachments 300 with contact portions 305 for ensuring direct contact with first heat sources 411, an effective heat exchange can be provided. The second heat source module 420 can be abutting the first flat plate 211 so that heat dissipated from it can be received by the first tube 210.

Figure 10:
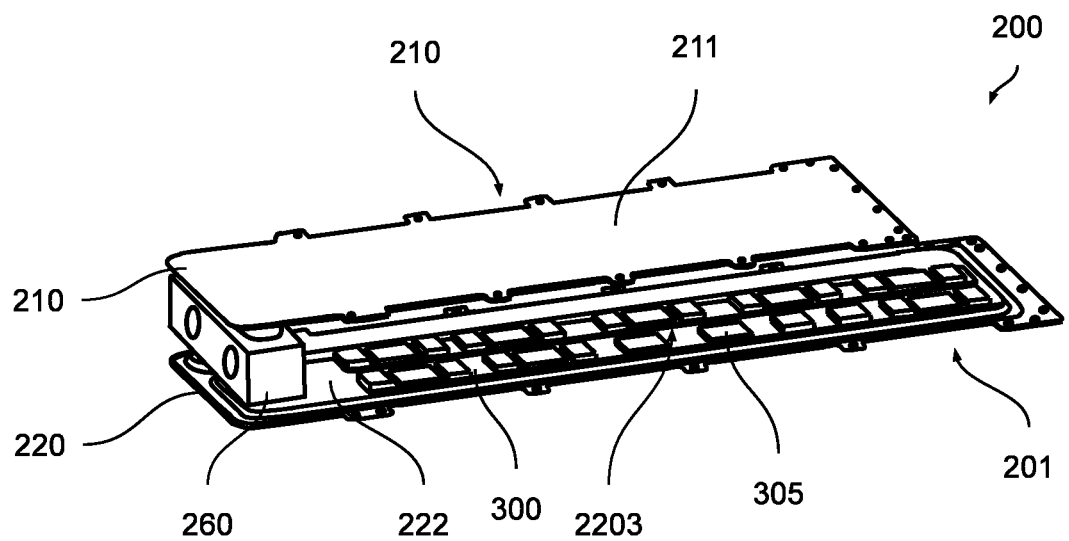
FIG. 10 shows a heat exchanger in a perspective view from above.
Figure 11:
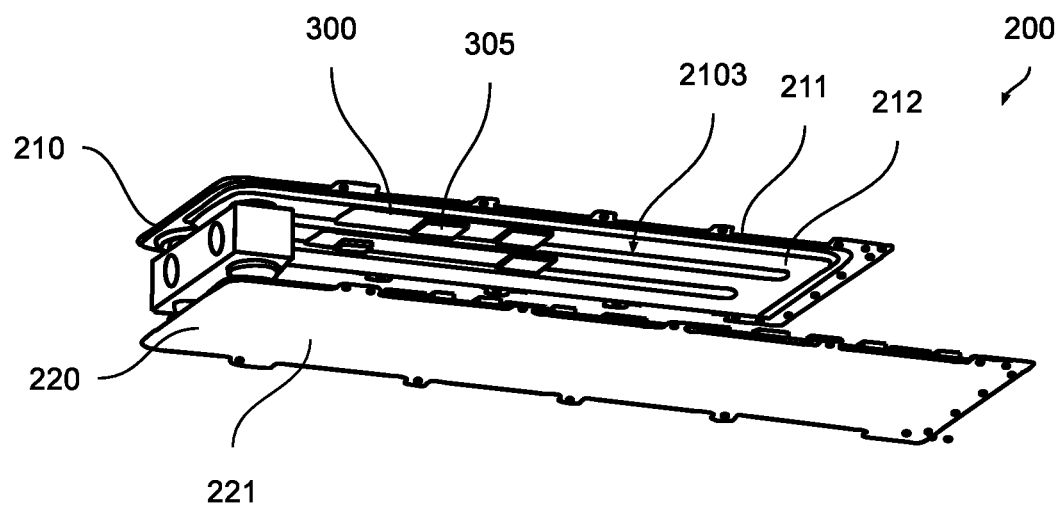
FIG. 11 shows a heat exchanger in a perspective view from below.

FIGS. 10 and 11 respectively show the heat exchanger 200 in a perspective view from above and below. The second tube 220 can be made of heat exchange plates 201. In the shown embodiment, the second tube 220 includes has a second flat plate 221 and a second shaped plate 222 connected to each other to form a second tube channel 2203.

The first and second flat plates 211, 221 and the first and second shaped plates 212, 222 include fluid openings 2101, 2102, 2201, 2202 (as better seen in FIGS. 19, 20) to enable fluid flow to and from the first and second tubes 210, 220. In such case, the interconnectors 260 can connect respective openings 2101, 2102, 2201, 2202.

Preferably, the second tube 220 includes one or more attachments 300 with a plurality of contact portions 305 exposed to the plurality of third heat sources 431. The attachments 300 can be mounted on the second tube 220 adjacent to the second tube channel 2203.

In the shown embodiment, the first shaped plate 212 and the second shaped plate 222 face each other.

Figure 12:
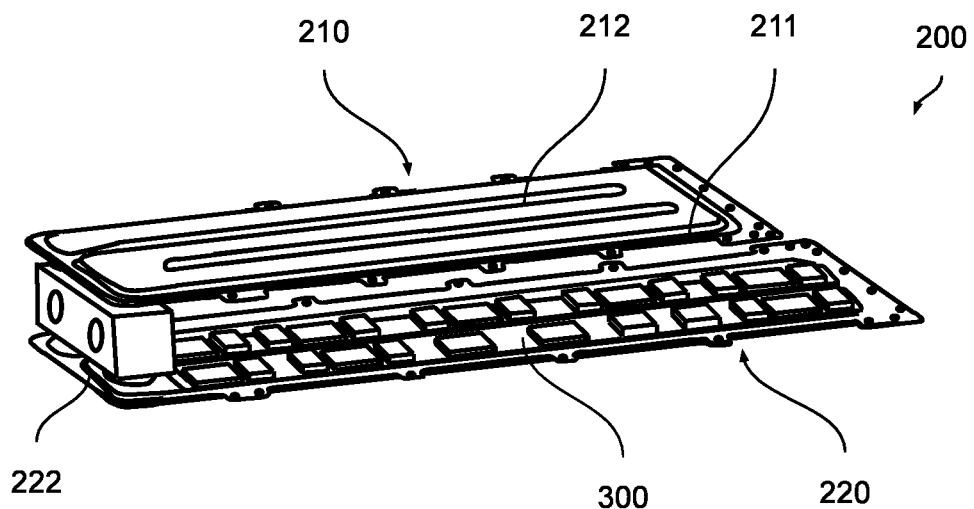
FIG. 12 shows another example a heat exchanger in a perspective view from above.

FIG. 12 shows another example a heat exchanger 200 in a perspective view from above, where the first shaped plate 212 faces away from the second shaped plate 222. Any of the first flat plate 211, the first shaped plate 212, the second flat plate 221 and the second shaped plate 222 can have one or more attachments 300 fixed thereto, depending on heat exchange needs and placement of specific heat sources. In this case, the first flat plate 211 and the second shaped plate 222 are equipped with attachments 300 to facilitate heat exchange with individual heat sources to be located in-between the first tube 210 and the second tube 220.

Figure 13:
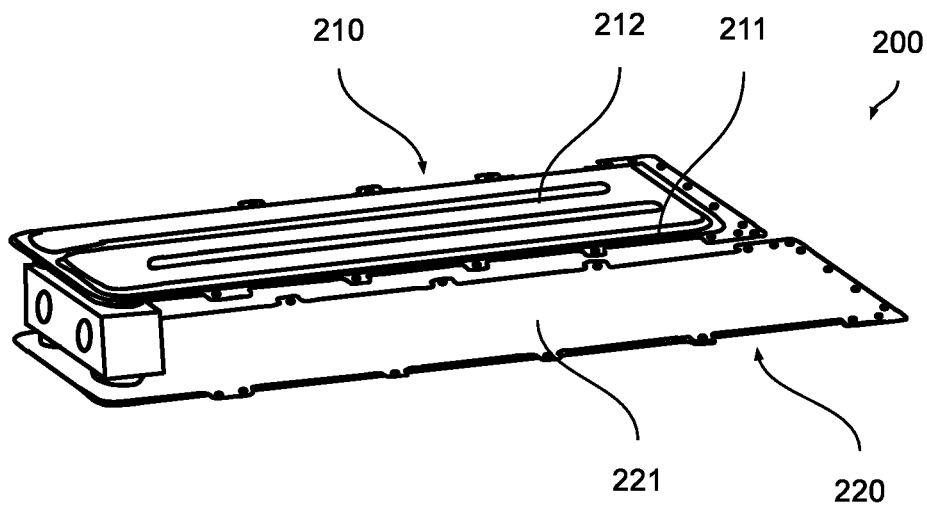
FIG. 13 shows another example a heat exchanger in a perspective view from above.

FIG. 13 shows another example a heat exchanger 200 in a perspective view from above, where the first flat plate 211 and the second flat plate 221 face each other. Any of the first flat plate 211, the first shaped plate 212, the second flat plate 221 and the second shaped plate 222 can have one or more attachments 300 fixed thereto, depending on heat exchange needs and placement of specific heat sources.

Figure 14:
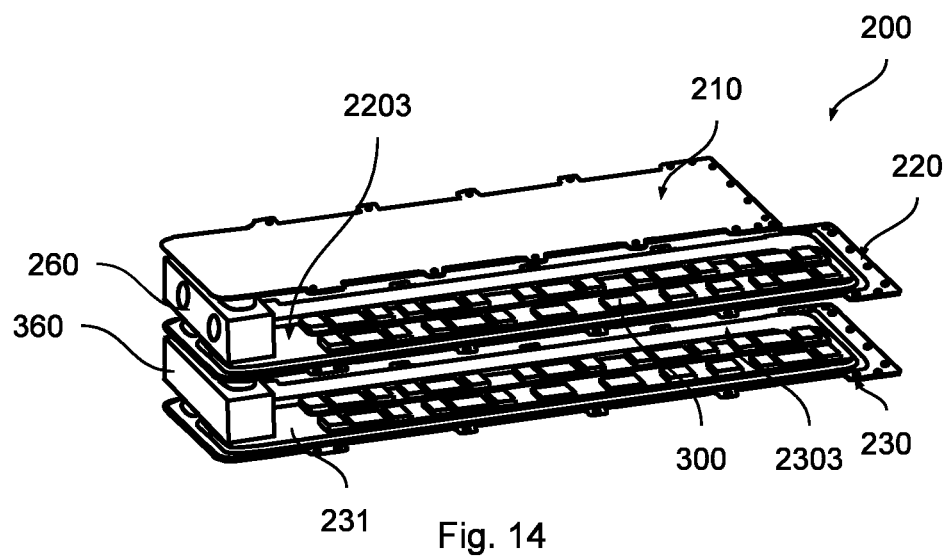
FIG. 14 shows another example a heat exchanger in a perspective view from above.
Figure 15:
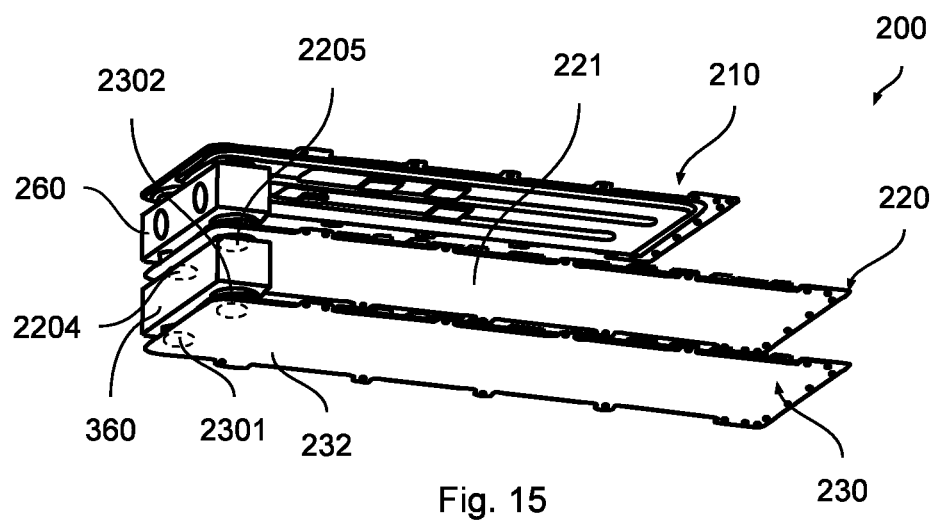
FIG. 15 shows another example a heat exchanger in a perspective view from below.

FIGS. 14 and 15 show another example a heat exchanger 200 in a perspective view respectively from above and below. The heat exchanger 200 can include a third tube 230 arranged in series with the first tube 210 and the second tube 220. In other words, the third tube 230 can be attached to the second tube 220, on its other side compared to the first tube 210. The third tube 230 can be connected to the second tube 220 by an additional interconnector 360. As explained in the context of FIGS. 31 and 32, the first tube 210 includes a first tube inlet 2101 and a first tube outlet 2102 interconnected by a first tube channel 2103, while the second tube 220 can include a second tube inlet 2201 and a second tube outlet 2202 interconnected by a second tube channel 2203.

The second tube 220 can include an additional second tube inlet 2204 and an additional second tube outlet 2205, for example placed on the opposite side of the second tube 220 compared with the second tube inlet 2201 and the second tube outlet 2202. The additional second tube inlet 2204 and the additional second tube outlet 2205 can be interconnected by the second tube channel 2203. The third tube 230 includes a third tube inlet 2301 and a third tube outlet 2302 interconnected by the third tube channel 2303.

The third tube 230 can include a third flat plate 231 and a third shaped plate 232 connected to each other to form the third tube channel 2303, wherein the third flat plate 231 and the third shaped plate 232 include a third tube inlet 2301 and a third tube outlet 2302 to enable fluid flow to and from the third tube 230. An attachment 300 can be used for the third tube 230 in a same manner as for the first tube 210 and the second tube 220. In any case, the third tube 230 can have an analogous structure to the first tube 210 and/or the second tube 220. There can also be a plurality of third tubes 230 in addition to the first tube 210 and the second tube 220.

In the shown example, the third shaped plate 232 faces the second flat plate 221.

Figure 16:
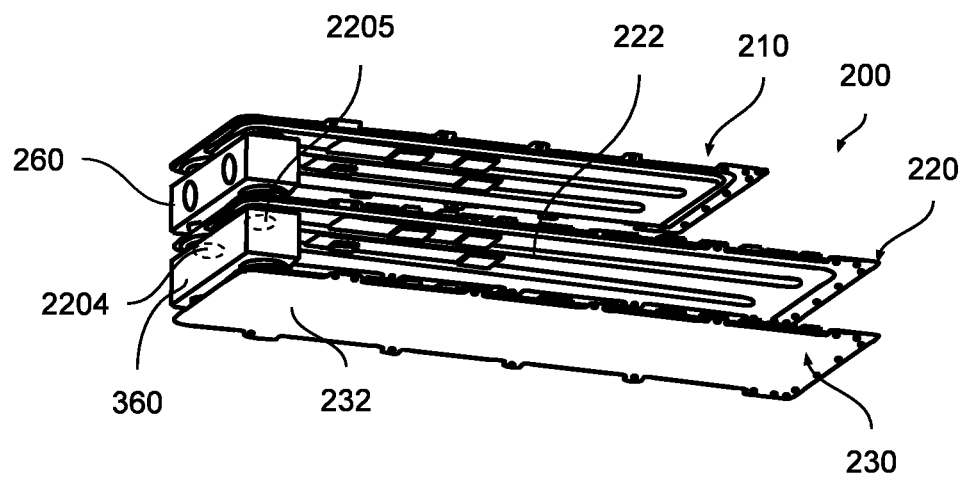
FIG. 16 shows another example a heat exchanger in a perspective view from below.

FIG. 16 shows another example a heat exchanger 200 in a perspective view from below. Compared to the example of the heat exchanger 200 of FIGS. 14 and 15, here the third shaped plate 232 faces the second shaped plate 222.

The heat exchanger can include an additional interconnector 360 with a body 261 having an upper inlet 2611 and a lower inlet 2621 connected by an inlet conduit, and an upper outlet 2614 and a lower outlet 2624 connected by an outlet conduit.

The inlet conduit and the outlet conduit can be fluidically isolated with respect to each other within the additional interconnector 360.

The additional interconnector 360 can be located between the second tube 220 and the third tube 230.

The additional interconnector 360 can be connected to the additional second tube inlet 2204 by the upper inlet 2611 of the additional interconnector 360 and to the additional second tube outlet 2205 by the upper outlet 2614 of the additional interconnector 360.

The additional interconnector 360 can be connected to the third tube inlet 2301 by the lower inlet 2621 of the additional interconnector 360 and to the third tube outlet 2302 by the lower outlet 2624 of the additional interconnector 360.

Figure 17:
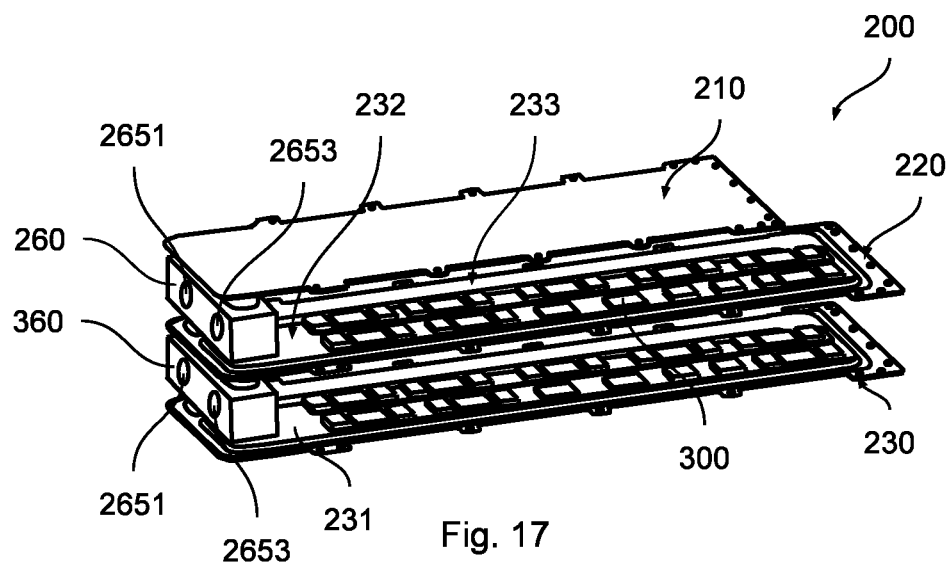
FIG. 17 shows another example a heat exchanger in a perspective view from above.

FIG. 17 shows another example a heat exchanger 200 in a perspective view from above. The body 261 of the additional interconnector 360 can include an external inlet 2651 communicated with the inlet conduit of the additional interconnector 360 and an external outlet 2653 communicated with the outlet conduit of the additional interconnector 360.

FIG. 18 shows the heat exchanger 200 of FIGS. 10 and 11 in a side view. The first tube 210 and the second tube 220 can be connected by an interconnector 260 to mechanically fix one to another and to enable heat exchange fluid to travel therebetween. In particular, the first tube inlet 2101, the first tube outlet 2102, the second tube inlet 2201 and the second tube outlet 2202 of the first tube 210 and the second tube 220 (shown in FIGS. 19 and 20) are connected by interconnector 260 to enable fluid flow therebetween.

FIG. 19 shows an example of a first tube 210. The first tube 210 includes a first tube channel 2103 to guide the heat exchange fluid through the first tube 210. The first tube 210 includes a first tube inlet 2101 and a first tube outlet 2102 for respectively introducing and egressing the heat exchange fluid from the first tube 210.

In the shown embodiment, the first tube channel 2103 forms a U-flow path having a first arm 214 and a second arm 215. The fluid openings 2101, 2102 can be arranged at the opposite ends of the U-flow path.

Figure 20:
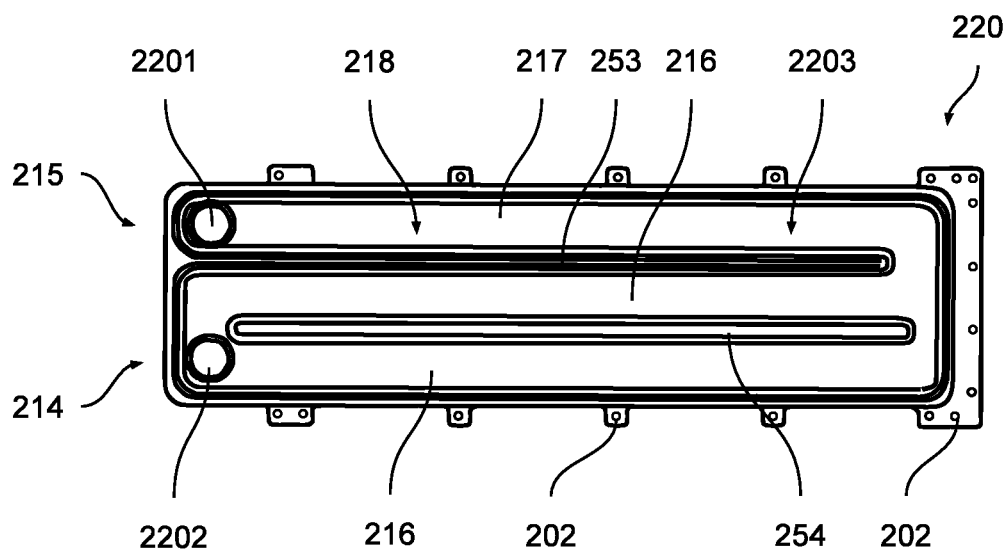
FIG. 20 shows an example of a second tube.

In relation to FIG. 20 and the second tube 220, the second tube channel 2203 can form a U-flow path having a first arm 214 and a second arm 215. The fluid openings 2201, 2202 can be arranged at the opposite ends of the U-flow path. The U-flow path of the first tube 210 can have a different length than the U-flow path of the second tube 220. In general, the first tube 210 can be shorter than the second tube 220. The first tube 210 can be longer than the second tube 220. The first tube 210 can also be of the same length as the second tube 220.

The first arm 214 can be split into at least two parallel sub-conduits 216. The second arm 215 can be formed by a single conduit 217. The split can be used to help balance the flow in the plate. It can also focus the flow to specific got spots to achieve better heat transfer coefficient.

The first arm 214 can be separated from the second arm 215 by a first wall 253 extending away from the ends of the U-flow path. The at least two sub-conduits 216 can be separated from each other by a second wall 254 extending away from the ends of the U-flow path. The first wall 253 can extend farther away from the ends of the U-flow path than the second wall 254. This as well can help management of the heat exchange as explained above. Preferably, the at least two parallel sub-conduits 216 terminate in common fluid openings.

In the shown embodiment, the first shaped plate 212 can include a stamped depression 218 forming together with the surface of the first flat plate 211 the first tube channel 2103. The stamped depression 218 can have a flat surface at the bottom, located away from the first flat plate 211.

FIG. 20 shows an example of a second tube 220. The second tube 220 includes a second tube channel 2203 to guide the heat exchange fluid throughout the second tube 220. The second tube 220 includes fluid openings 2201, 2202 for introducing and egressing the heat exchange fluid from the second tube 220.

In the shown embodiment, the second tube channel 2203 forms a U-flow path having a first arm 214 and a second arm 215. The fluid openings can be arranged at the opposite ends of the U-flow path.

The first arm 214 can be split into at least two parallel sub-conduits 216. The second arm 215 can be formed by a single conduit 217.

The first arm 214 can be separated from the second arm 215 by a first wall 253 extending away from the ends of the U-flow path. The at least two sub-conduits 216 can be separated from each other by a second wall 254 extending away from the ends of the U-flow path. The first wall 253 can extend farther away from the ends of the U-flow path than the second wall 254. Preferably, the at least two parallel sub-channels 216 terminate in common fluid openings.

In the shown embodiment, the second shaped plate 222 can include a stamped depression 218 forming together with the surface of the second flat plate 221 the second tube channel 2203. The stamped depression 218 can have a flat surface at the bottom, located away from the second flat plate 221.

In the shown embodiment, the second shaped plate 222 includes fluid openings 2201, 2202 for the fluid to enable fluid flow to and from the second tube 220, while the second flat plate 221 lacks any fluid openings for the fluid.

Figure 21:
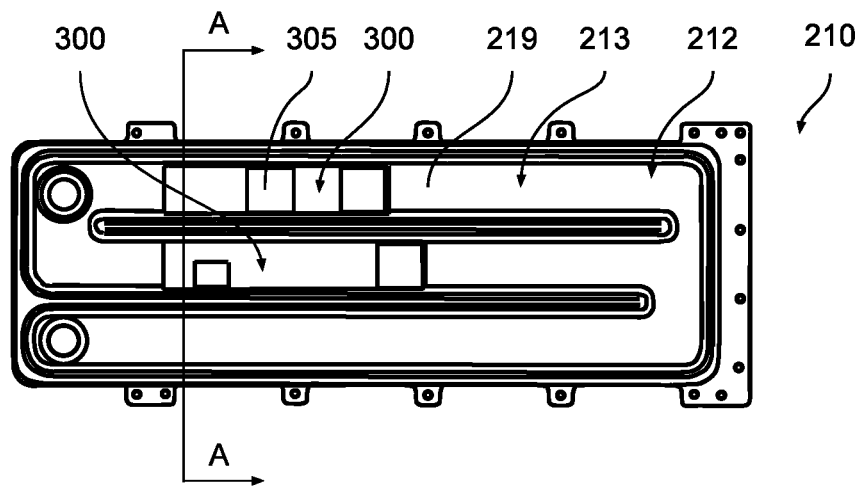
FIG. 21 shows an example of a first tube with attachments.
Figure 23:
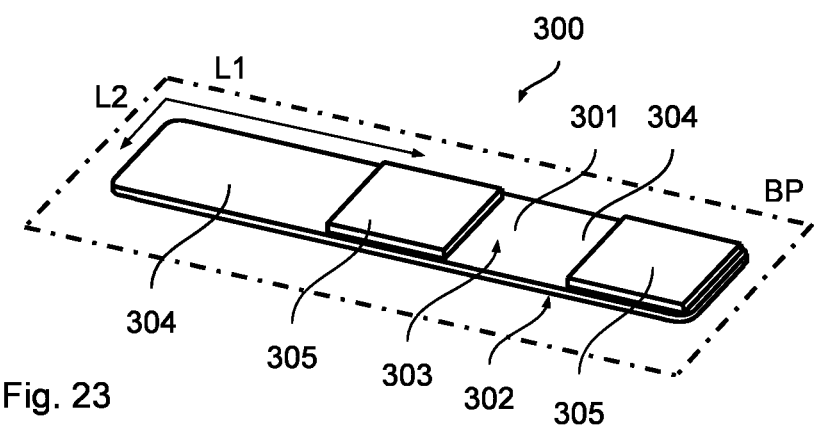
FIG. 23 shows another example of an attachment.

FIG. 21 shows an example of a first tube 210 with attachments 300. The first tube 210 includes the first shaped plate 212, which allows defining the first tube channel 2103 together with the first flat plate 211. In general, the first tube channel 2103 can have a channel wall 219 formed by any heat exchange plate 201, in this case the first shaped plate 212. One or more attachments 300 can be attached to that channel wall 219. The attachment 300 generally has a bottom side 302 and a top side 303 (as shown in FIG. 23). The attachment 300 can be connected to the channel wall 219 by the bottom side 302.

The attachment 300 can have a single contact portion 305 or a plurality of contact portions 305 extending away from a top side 303, preferably independently from each other. By a contact portion 305 it is here understood a dedicated part of the attachment 300 intended to be in contact with a specific heat source so that heat can be exchanged therebetween in a facilitated manner. It is intended for the contact portion 305 to receive bulk of the energy from the heat source as opposed to sections of the attachment 300 where contact portion 305 is not present.

As shown in FIGS. 22-30, the attachment 300 has an attachment base plate 301 extending within a base plane BP. A thickness T is defined as extending between the bottom side 302 and the top side 303 between of the attachment base plate 301. The attachment base plate 301 can be of rectangular, elongated outline extending along an attachment longitudinal axis L1 and an attachment lateral axis L2, the extension along the attachment longitudinal axis L1 being predominant.

Figure 22:
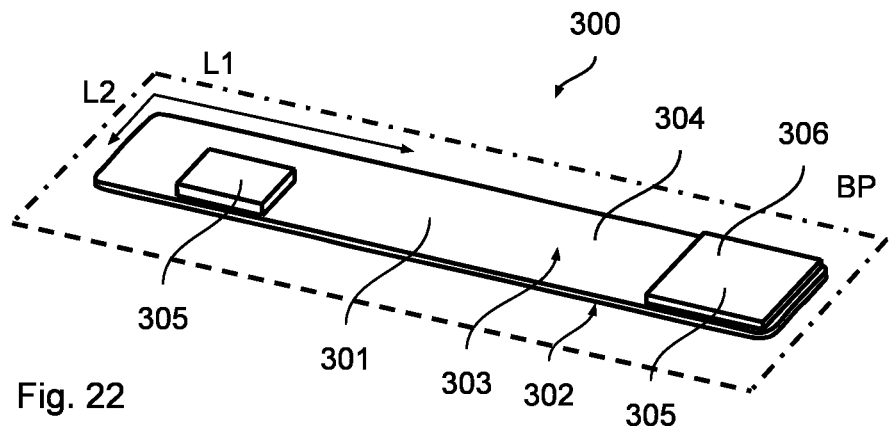
FIG. 22 shows an example of an attachment.

FIG. 22 shows an example of an attachment 300, with two contact portions 305. Contact portions 305 extend away from the top side 303 perpendicularly to the base plane BP.

In one embodiment, the attachment base plate 301 and the contact portions 305 are a single machined piece. Alternatively, the contact portions 305 can be connected to the attachment base plate 301 by means of an adhesive. Preferably, the plurality of contact portions 305 are made of a solid material. Preferably, the attachment 300 is made of a material of high thermal conductivity. Preferably, the attachment 300 and the contact portions 305 are made of metal. In such case, the contact portions 305 can be connected to the attachment base plate 301 by brazing.

In the shown embodiment, there is a distancing section 304 between the contact portions 305. Here, the distancing section 304 is a region of the base plate 301, in particular of its top side 303, where the contact portions 305 are not present. The distancing section 304 can allow to reduce the amount of material needed for the attachment 300 in areas more remote with respect to heat sources than the contact portions 305. The distancing sections 304 however, in particular the region of the attachment base plate 301 at its bottom side 302, can contribute to secure connection of the attachment 300 to any heat exchange plate 201 (in these cases a first flat plate 211, a first shaped plate 212, a second flat plate 221, a second shaped plate 222), as sufficient contact surface between the attachment 300 and said heat exchange plate 201 is ensured.

In any case, it is preferable for the contact portions 305 to have a contact surface adapted for intermediate surface of a heat source that they are intended to face to maximize heat exchange efficiency. Preferably, the contact portions 305 have flat top contact surface 306, especially when they are matched with integrated circuits, which themselves tend to have flat surfaces.

Figure 26:
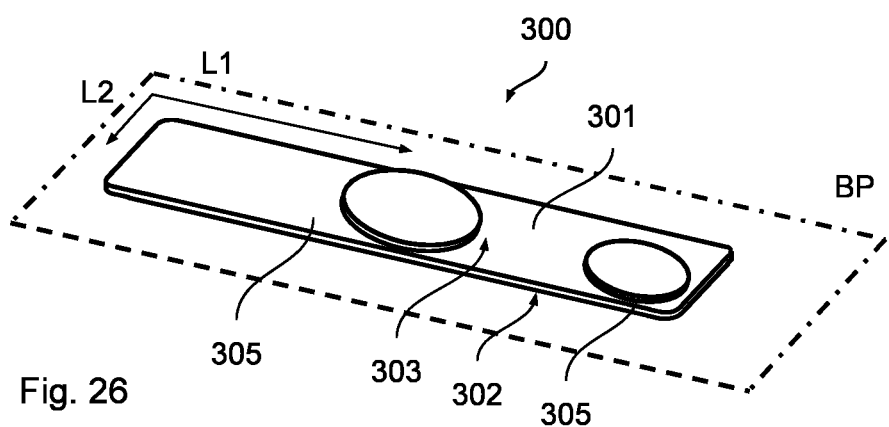
FIG. 26 shows another example of an attachment.

Any contact portion 305 can have a rectangular outline, e.g. square outline (as shown in FIGS. 21, 22) or a rounded outline, e.g. oval or circular (as shown in FIG. 26), the outline extending in its width and length dimensions.

FIG. 23 shows another example of an attachment 300. In this case, the two contact portion 305 are identical to each other and are separated by a distancing section 304. It is worth noting that the distancing section 304 can be present between any contact portion 305 and an edge of the attachment base plate 301, not only strictly between the contact portions 305.

Figure 24:
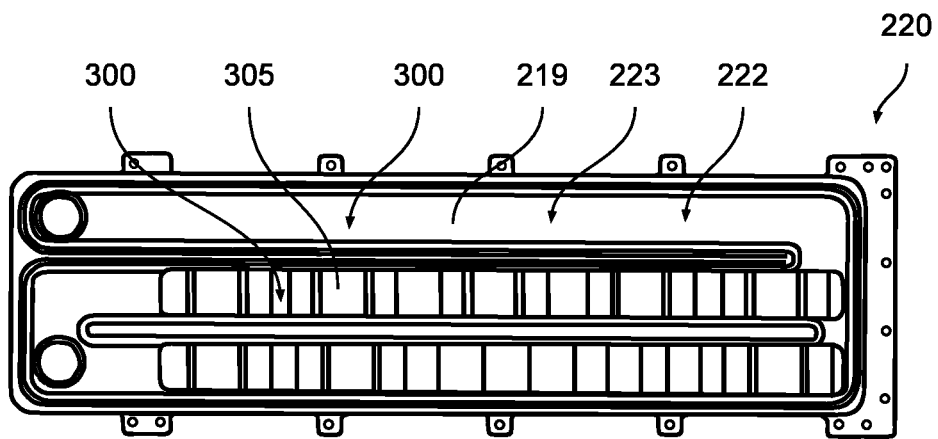
FIG. 24 shows an example of a second tube with attachments.

FIG. 24 shows an example of a second tube 220 with attachments 300. The second tube 220 includes the second shaped plate 222, which allows defining the second tube channel 2203 together with the second flat plate 221. In general, the second tube channel 2203 can have a channel wall 219 formed by any heat exchange plate 201, in this case the second shaped plate 222. One or more attachments 300 can be attached to that channel wall 219, for example analogously to how it was described earlier in relation to the first tube 210.

Figure 25:
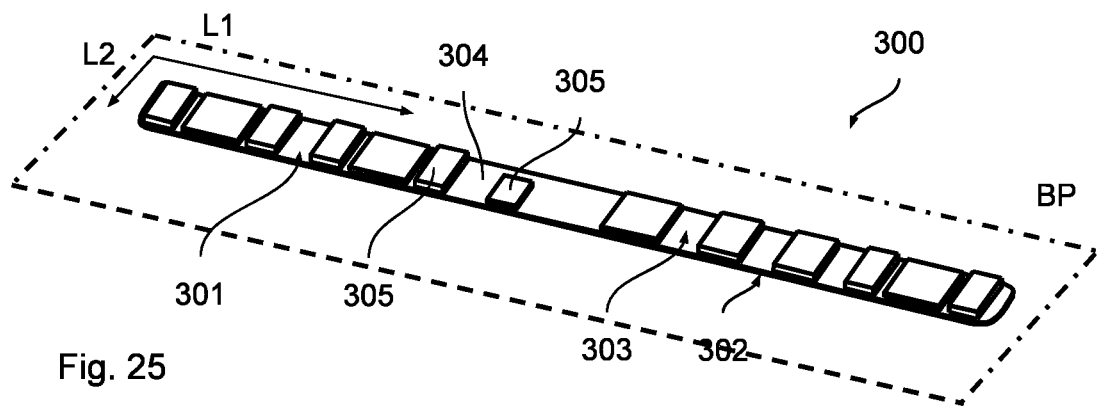
FIG. 25 shows another example of an attachment.

FIG. 25 shows another example of an attachment 300. In this case, the attachment 300 for a second tube 220 is presented, including a plurality of contact portions 305. The presented contact portions 305 can differ from each other in terms of size and shape to accommodate differently shaped and sized heat sources, in this case the third heat sources 431. The nature of envisaged differentiation will be explained in relation to following figures.

Figure 27:
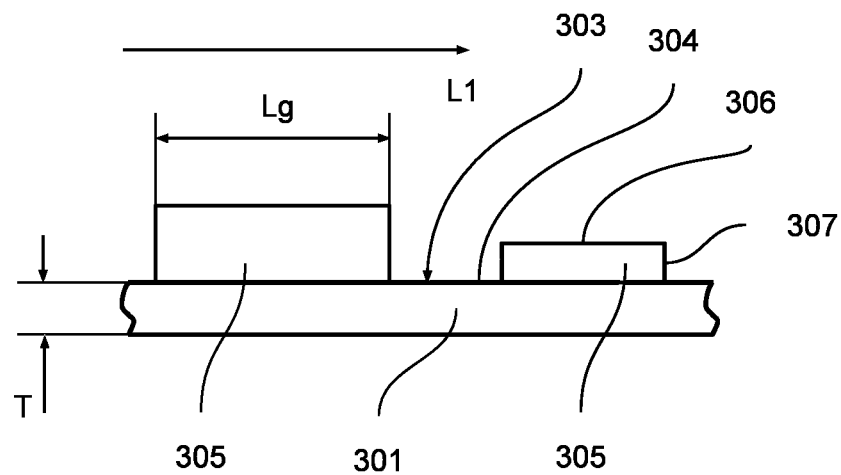
FIG. 27 shows a partial side view of an attachment in detail.

FIG. 27 shows schematically a partial side view of an attachment 300 of FIG. 25 in detail. The top side 303 can have a distancing section 304 between neighboring contact portions 305, the distancing section 304 maintaining the thickness T.

In one embodiment, at least one contact portion 305 extends from the attachment base plate 301 farther than another contact portion 305. In other words, one contact portion 305 can have different height than another contact portion 305.

In one embodiment, at least one contact portion 305 has a different longitudinal length Lg than another contact portion 305, the longitudinal length Lg being measured along the attachment longitudinal axis L1.

The top side 303 of the attachment base plate 301 and the flat top contact surfaces 306 of the contact portions 305 can be connected by side walls 307 of the contact portions 305, the side walls 307 being perpendicular to the top side 303 and the flat top contact surfaces 306. Alternatively, the side walls 307 can be oblique with respect to the top side 303 and/or the flat top contact surfaces 306.

Figure 28:
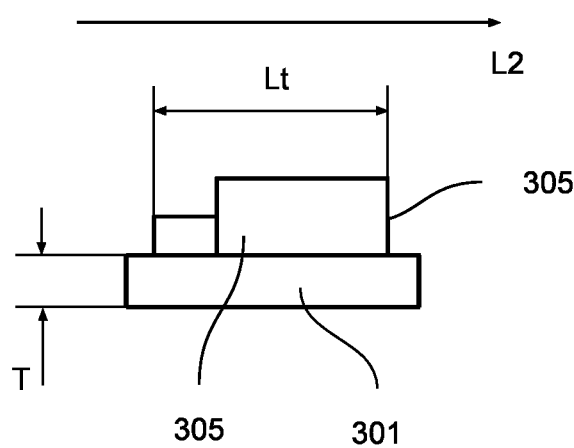
FIG. 28 shows another side view of an attachment in detail.

FIG. 28 shows schematically another side view of an attachment 300 in detail of FIG. 25 in detail. At least one contact portions 305 can have a different lateral length Lt than another contact portion 305, the lateral length Lt being measured along the attachment lateral axis L2.

Figure 29:
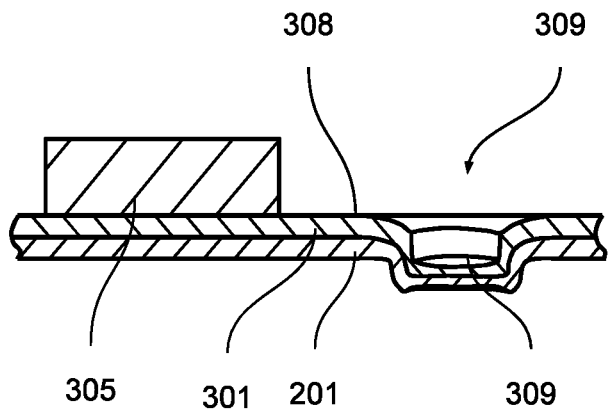
FIG. 29 shows an example of a partial cross-sectional view of a shaped plate with an attachment.

FIG. 29 shows schematically an example of a partial cross-sectional view of a heat exchange plate 201 with an attachment 300. The attachment base plate 301 can have connection section 308 adapted for clinching. As explained earlier, the top side 303 of the attachment base plate 301 can have a distancing section 304 between the contact portions 305, the distancing section 304 maintaining the thickness T of the attachment base plate 301. The attachment base plate 301 can be clinched to the channel wall 219 of any heat exchange plate 201 (e.g. the first flat plate 211, the first shaped plate 212, the second flat plate 221, the second shaped plate 222) at the distancing section 304 by a clinched connection 309. Such clinched connection 309 may be an intermediate step for connecting the attachment 300 to any heat exchange plate 201, which subsequently can be finally fixed by means of brazing. In such case, the clinched connection 309 serves to position the components in relation to one another so that the brazing process can be efficiently performed.

Figure 30:
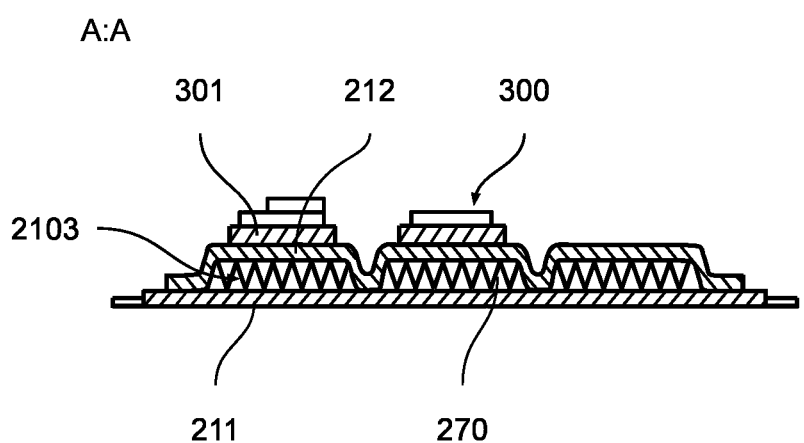
FIG. 30 shows a cross-section view of the first tube of FIG. 20.

FIG. 30 shows a cross-section view of the first tube 210 of FIG. 19. An inner fin 270 for improving heat exchange efficiency can be placed within the first tube channel 2103. It can be present in select arms 214 or conduits 217 or sub-conduits 216 of the first tube channel 2103, or can fill them all at the same time. The same applies mutatis mutandis to the second tube 220 or other tubes if present.

Figure 31:
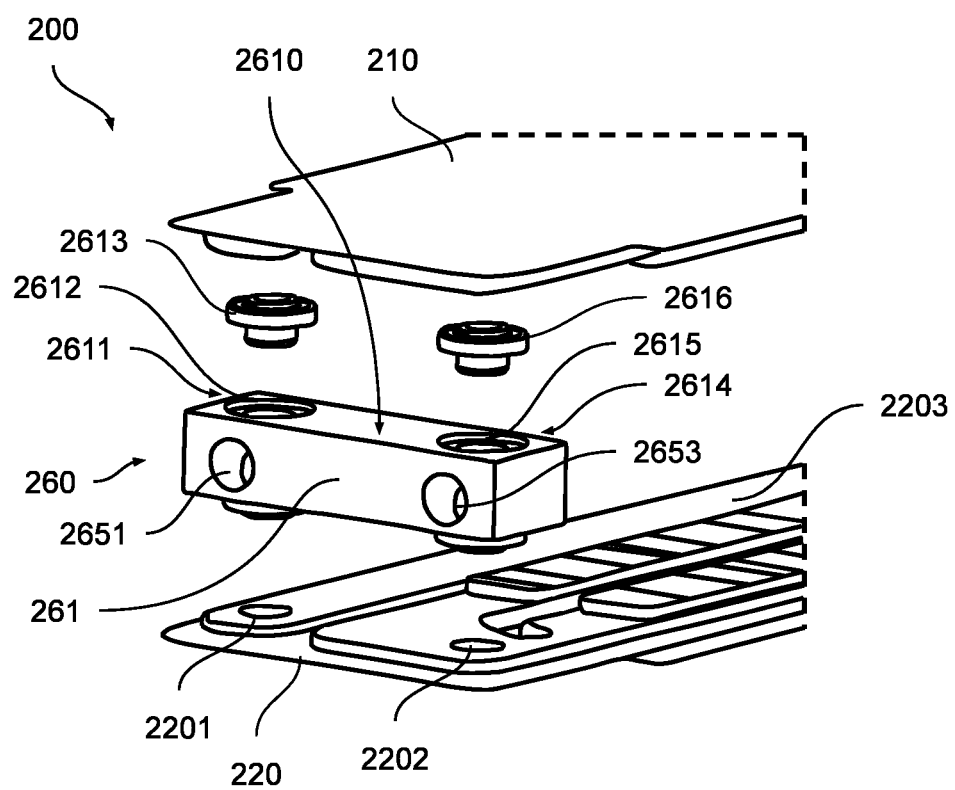
FIG. 31 shows another example a heat exchanger in an exploded view from above.
Figure 32:
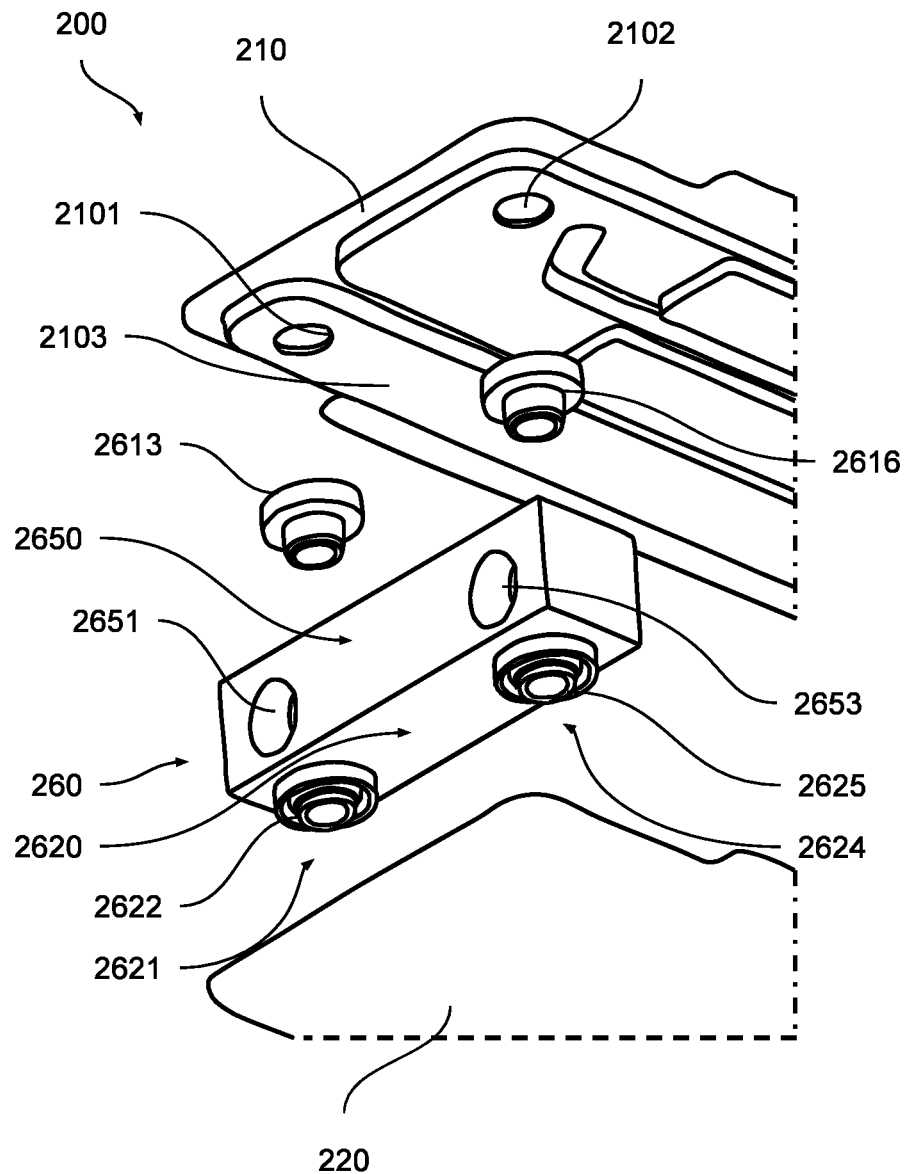
FIG. 32 shows another example a heat exchanger in an exploded view from below.

FIGS. 31 and 32 show another example a heat exchanger 200 in exploded views respectively from above and below. The heat exchanger 200 comprises a first tube 210 with a first tube inlet 2101 and a first tube outlet 2102 interconnected by a first tube channel 2103 and a second tube 220 with a second tube inlet 2201 and a second tube outlet 2202 interconnected by a second tube channel 2203. The interconnector 260 includes an upper face 2610 and a lower face 2620. The upper face 2610 faces the first tube 210, while the lower face 2620 faces the lower tube 220.

The interconnector 260 is connected to the first tube inlet 2101 by an upper inlet 2611 and to the first tube outlet 2102 by the upper outlet 2614. The interconnector 260 is connected to the second tube inlet 2201 by a lower inlet 2621 and to the second tube outlet 2202 by a lower outlet 2624.

The interconnector 260 can be located between the first tube 210 and the second tube 220. Preferably, the interconnector 260 is located at the ends of the first tube 210 and the second tube 220.

The interconnector 260 includes a body 261 with the upper inlet 2611 and the lower inlet 2621 connected by an inlet conduit (not shown). The body 261 includes the upper outlet 2614 and the lower outlet 2624 connected by an outlet conduit (not shown). The body 261 also includes an external inlet 2651 communicated with the inlet conduit and an external outlet 2653 communicated with the outlet conduit.

The external inlet 2651 can face away from the first tube 210 and the second tube 220.

The interconnector 260 has an upper inlet collar 2613 inserted into an upper inlet collar opening 2612 of the interconnector 260. The upper inlet collar 2613 connects the upper inlet 2611 with the first tube inlet 2101.

In this embodiment, the interconnector 260 has an integrated lower inlet collar 2622 connecting the lower inlet 2621 with the second tube inlet 2201.

Figure 33:
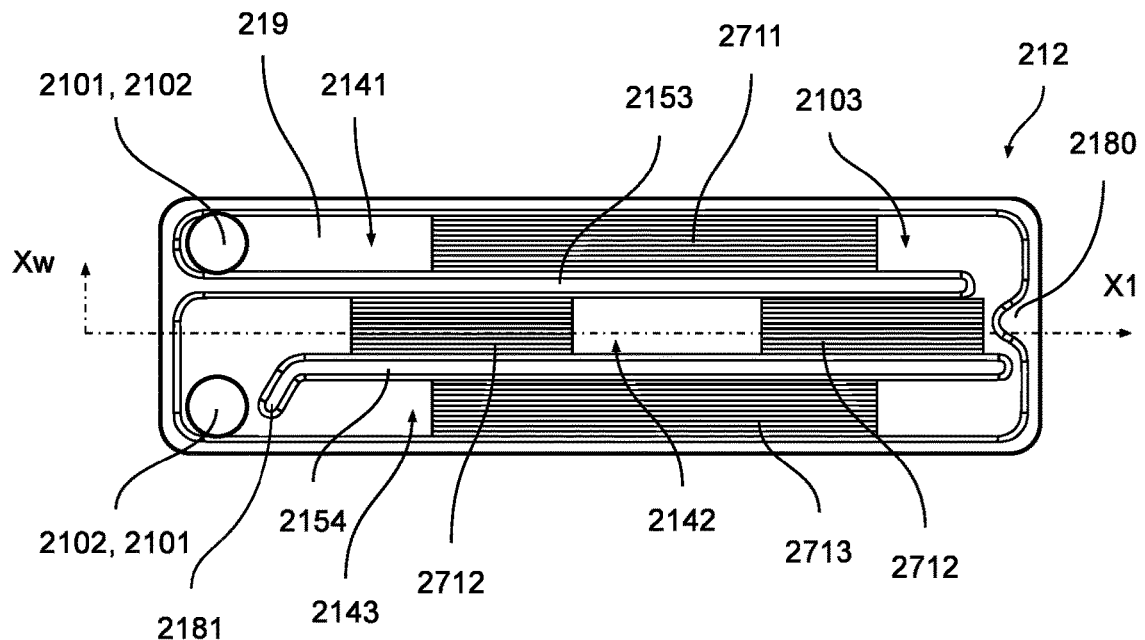
FIG. 33 shows an example of a first stamped plate of the first tube.
Figure 34:
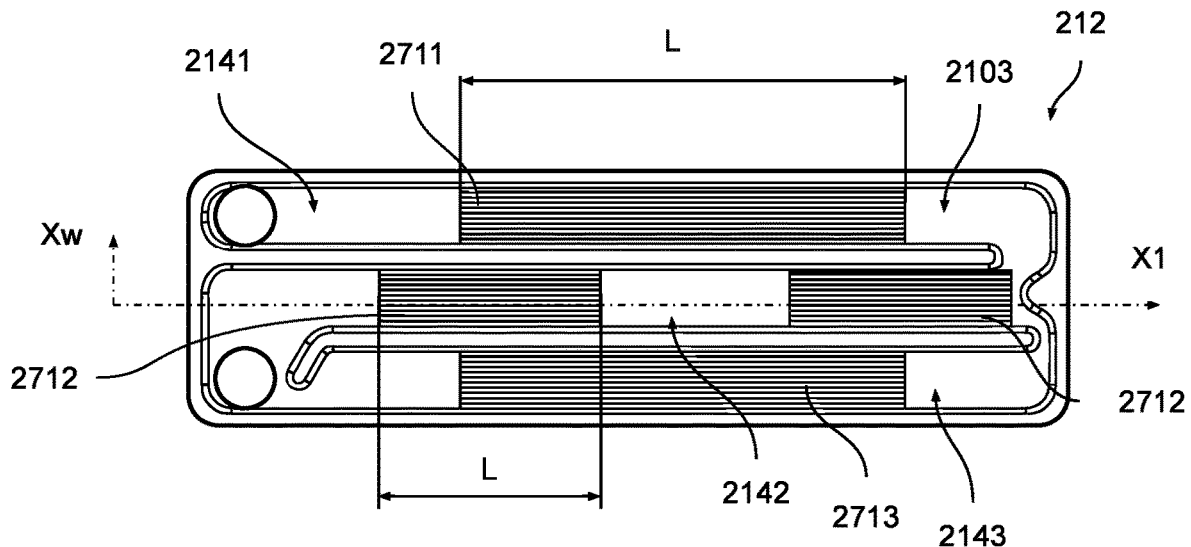
FIG. 34 shows another instance of the example of the first stamped plate of FIG. 33.

FIGS. 33 and 34 show an example of a first stamped plate 212 of the first tube 210. The first tube channel 2103 can extend along a first tube extension axis X1. The first tube channel 2103 forms a first primary arm 2141 and a second primary arm 2142 extending parallel to each other along the first tube extension axis X1. The first tube channel 2103 can further form a third primary arm 2143 extending parallel to the first primary arm 2142 and the second primary arm 2142.

The first tube channel 2103 forms a U-shaped flow path with the first tube inlet 2101 and the first tube outlet 2102 located at opposite ends thereof. The first primary arm 2141, the second primary arm 2142 and the third primary arm 2143 are arranged so that the first primary arm 2141 is in counterflow relation to the second and third primary arms 2142, 2143.

In one example, the first tube inlet 2101 is arranged at the first primary arm 2141 at one end of the first tube channel 2103, and the first tube outlet 2102 is arranged at the second and third primary arms 2142, 2143 at another end of the first tube channel 2103.

In another example, the first tube outlet 2102 is arranged at the first primary arm 2141 at one end of the first tube channel 2103, and the first tube inlet 2101 is arranged at the second and third primary arms 2142, 2143 at another end of the first tube channel 2103.

The first primary arm 2141 is separated from the second primary arm 2142 by a first primary wall 2153 extending away from the ends of the U-flow path. The second primary arm 2142 is separated from the third primary arm 2143 by a second primary wall 2154. The second primary wall 2154 can extend in parallel to the first primary wall 2153, preferably farther away from the ends of the U-flow path than the first primary wall 2153. The second primary wall 2154 divides the flow of the fluid between the second primary arm 2142 and the third primary arm 2143. However, in the vicinity of the mid-section of the U-flow path, the second primary arm 2142 and the third primary arm 2143 are un-separated, and so are they in the vicinity of their respective end of the U-flow path. The mid-section of the U-flow path of the first tube channel 2103 can include a first primary guiding protrusion 2180 extending into the second primary arm 2142 along the first tube extension axis X1. In particular, the first primary guiding protrusion 2180 can extend from the flat portion of the first stamped plate 212, which encircles first tube channel 2103. The first primary guiding protrusion 2180 can be at least partly an unstamped, flat portion of the first stamped plate 212. The first primary guiding protrusion 2180 effectively limits the amount of fluid that travels through the second primary arm 2142, thereby forcing part of the fluid to travels through the third primary arm 2143. Consequently, a desired cooling performance can be achieved. Further, at the end of the U-flow path defined by the second and third primary arms 2142, 2143, the second primary wall 2154 can include a second primary guiding protrusion 2181 extending from the second primary wall 2154 obliquely with respect to the first tube extension axis X1 away from the first primary arm 2141. The second primary guiding protrusion 2181 can be at least partly an unstamped, flat portion of the first stamped plate 212. The second primary guiding protrusion 2181 effectively limits the amount of fluid that travels through the third primary arm 2143, thereby forcing part of the fluid to travels through the second primary arm 2143. Consequently, a desired cooling performance can be achieved.

The first primary arm 2141 can include a first primary inner fin 2711. The second primary arm 2142 can include a second primary inner fin 2712. The third primary arm 2143 can include a third primary inner fin 2713. In one example, the second primary arm 2142 includes another second primary inner fin 2712 so that the two second primary inner fins 2712 are distanced from each other. The empty space between the two second primary inner fins 2712 can be representative of an area of lower thermal needs, and since it does not require fin presence can contribute to cost saving. The first primary inner fin 2711, second primary inner fin 2712 and the third primary inner fin 2713 can be arranged to ensure effective heat exchange in specific areas of the first tube channel 2103 by enlarging a heat exchange surface between the fluid and the material of the first tube 210 and/or by inducing turbulent flow. For example, the first primary inner fin 2711, second primary inner fin 2712 and/or the third primary inner fin 2713 can be arranged in areas of increased thermal needs.

In another, not shown example, the first primary arm 2141 includes another first primary inner fin 2711 so that the two first primary inner fins 2711 are distanced from each other.

In another, not shown example, the third primary arm 2143 includes another third primary inner fin 2713 so that the two third primary inner fins 2713 are distanced from each other.

In another, not shown example, the second primary arm 2142 includes a single second primary inner fin 2712.

The first primary inner fin 2711 and the second primary inner fin 2712 can extend along the first tube extension axis X1 to define respectively a length L of the first primary inner fin 2711 and a length L of the second primary inner fin 2712. The third primary inner fin 2713 can extend along the first tube extension axis X1 to define a length L of the third primary inner fin 2713.

In general, lengths L of the parts/components of first tube 210 are measured parallel to the first tube extension axis XL.

The lengths L of the first primary inner fin 2711, the second primary inner fin 2712 and the third primary inner fin 2713 can be preferably comprised between 50 and 200 mm. In the shown example, the first primary inner fin 2711 measures 160 mm, the two second primary inner fins 2712 each measure 80 mm and the third primary inner fin 2713 measures 160 mm. Preferably, the second primary inner fins 2712 have a length equal to 50% of lengths of the first primary inner fin 2711 and/or of the third primary inner fin 2713, so only one (larger) length needs to be procured, with the second primary inner fins 2712 being obtained by cutting the fins in half.

The length L of the first primary arm 2141 can be preferably comprised between 230 and 300 mm. In the shown example, the length L of the first primary arm 2141 is 290 mm.

The length L of the second primary arm 2142 can be preferably comprised between 230 and 300 mm. In the shown example, the length L of the second primary arm 2142 is 290 mm.

The length L of the third primary arm 2143 can be preferably comprised between 230 and 300 mm. In the shown example, the length L of the third primary arm 2143 is 290 mm.

The length L of the first primary wall 2153 can be preferably comprised between 240 and 290 mm. In the shown example, the length L of the first primary wall 2153 is 270 mm.

The length L of the second primary wall 2154 can be preferably comprised between 170 and 220 mm. In the shown example, the length L of the second primary wall 2154 is 190 mm. This length is not taking account the first primary guiding protrusion 2180 and the second primary guiding protrusion 2181.

The length L of the first primary guiding protrusion 2180 can be preferably comprised between 5 and 12 mm. In the shown example, the length L of the first primary guiding protrusion 2180 is 8 mm.

The length L of the second primary guiding protrusion 2181 can be preferably comprised between 6 and 14 mm. In the shown example, the length L of the second primary guiding protrusion 2181 is 10 mm.

Figure 35:
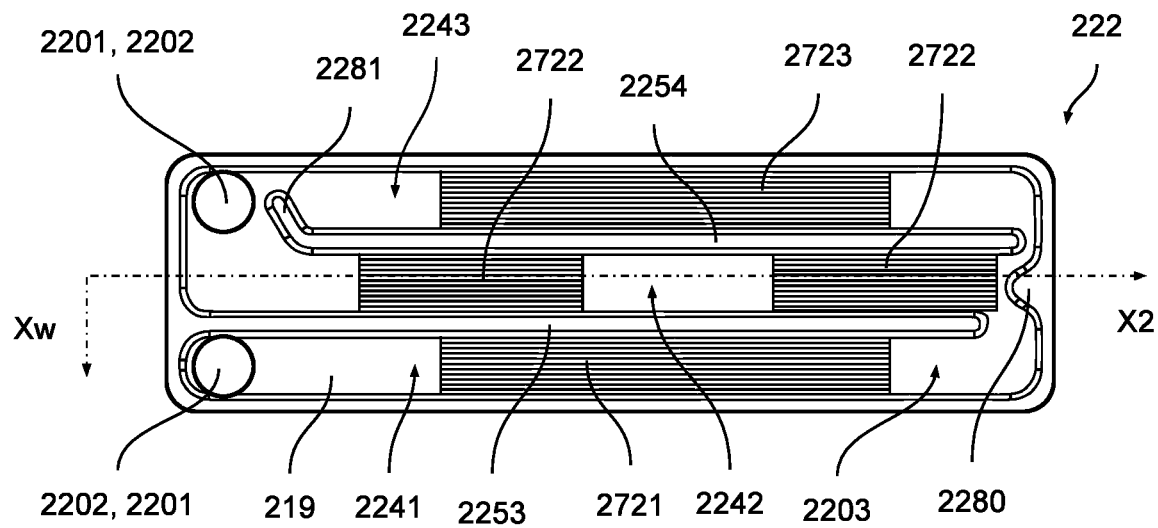
FIG. 35 shows an example of a second stamped plate of the second tube.
Figure 36:
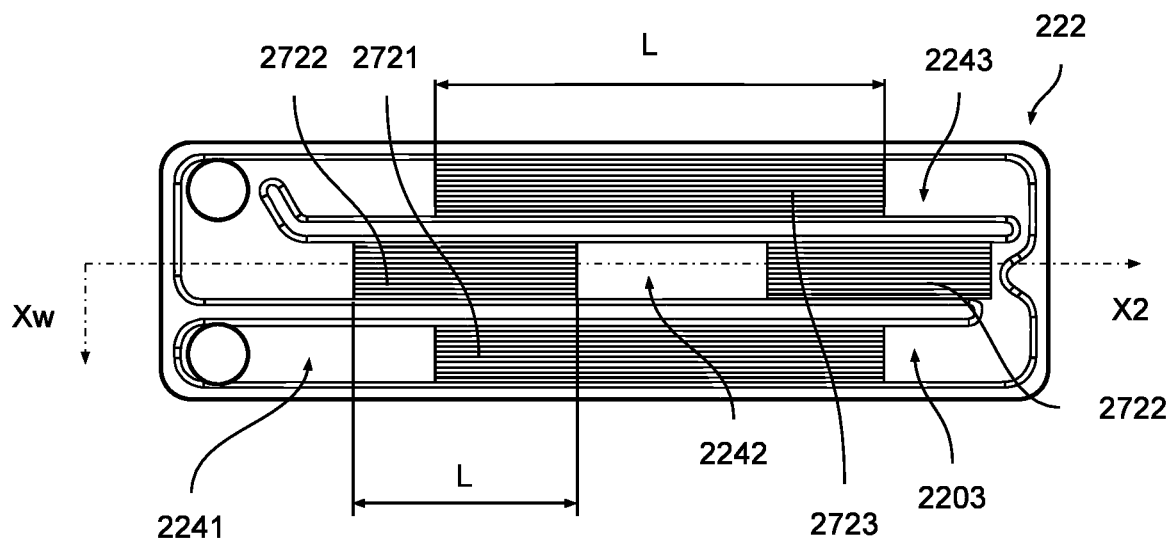
FIG. 36 shows another instance of the example of the second stamped plate of FIG. 35.

FIGS. 35 and 36 show an example of a second stamped plate 222 of the second tube 220.

The second tube channel 2203 can extend along a second tube extension axis X2. The second tube channel 2203 forms a first secondary arm 2241 and a second secondary arm 2242 extending parallel to each other along the second tube extension axis X2. The second tube channel 2203 can further form a third secondary arm 2243 extending parallel to the first secondary arm 2242 and the second secondary arm 2242.

The second tube extension axis X2 can be parallel to the first tube extension axis X1.

The second tube channel 2203 forms a U-shaped flow path with the second tube inlet 2201 and the second tube outlet 2202 located at opposite ends thereof. The first secondary arm 2241, the second secondary arm 2242 and the third secondary arm 2243 are arranged so that the first secondary arm 2241 is in counterflow relation to the second and third secondary arms 2242, 2243.

In one example, the second tube inlet 2201 is arranged at the first secondary arm 2241 at one end of the second tube channel 2203, and the second tube outlet 2202 is arranged at the second and third secondary arms 2242, 2243 at another end of the second tube channel 2203.

In another example, the second tube outlet 2202 is arranged at the first secondary arm 2241 at one end of the second tube channel 2203, and the second tube inlet 2201 is arranged at the second and third secondary arms 2242, 2243 at another end of the second tube channel 2203.

The first secondary arm 2241 is separated from the second secondary arm 2242 by a first secondary wall 2253 extending away from the ends of the U-flow path. The second secondary arm 2242 is separated from the third secondary arm 2243 by a second secondary wall 2254. The second secondary wall 2254 can extend in parallel to the first secondary wall 2253, preferably farther away from the ends of the U-flow path than the first secondary wall 2253. The second secondary wall 2254 divides the flow of the fluid between the second secondary arm 2242 and the third secondary arm 2243. However, in the vicinity of the mid-section of the U-flow path, the second secondary arm 2242 and the third secondary arm 2243 are un-separated, and so are they in the vicinity of their respective end of the U-flow path. The mid-section of the U-flow path of the second tube channel 2203 can include a first secondary guiding protrusion 2280 extending into the second secondary arm 2242 along the second tube extension axis X2. In particular, the first secondary guiding protrusion 2280 can extend from the flat portion of the second stamped plate 222, which encircles second tube channel 2203. The first secondary guiding protrusion 2280 can be at least partly an unstamped, flat portion of the second stamped plate 222. The first secondary guiding protrusion 2280 effectively limits the amount of fluid that travels through the second secondary arm 2242, thereby forcing part of the fluid to travels through the third secondary arm 2243. Consequently, a desired cooling performance can be achieved. Further, at the end of the U-flow path defined by the second and third secondary arms 2242, 2243, the second secondary wall 2254 can include a second guiding protrusion 2281 extending from the second secondary wall 2254 obliquely with respect to the second tube extension axis X2 away from the first secondary arm 2241. The second guiding protrusion 2281 can be at least partly an unstamped, flat portion of the second stamped plate 222. The second guiding protrusion 2281 effectively limits the amount of fluid that travels through the third secondary arm 2243, thereby forcing part of the fluid to travels through the second secondary arm 2243. Consequently, a desired cooling performance can be achieved.

The first secondary arm 2241 can include a first secondary inner fin 2721. The second secondary arm 2242 can include a second secondary inner fin 2722. The third secondary arm 2243 can include a third secondary inner fin 2723. In one example, the second secondary arm 2242 includes another second secondary inner fin 2722 so that the two second secondary inner fins 2722 are distanced from each other. The empty space between the two second secondary inner fins 2722 can be representative of an area of lower thermal needs, and since it does not require fin presence made contribute to cost saving. The first secondary inner fin 2721, second secondary inner fin 2722 and the third secondary inner fin 2723 can be arranged to ensure effective heat exchange in specific areas of the second tube channel 2203 by enlarging a heat exchange surface between the fluid and the material of the second tube 220 and/or by inducing turbulent flow. For example, the first secondary inner fin 2721, second secondary inner fin 2722 and/or the third secondary inner fin 2723 can be arranged in areas of increased thermal needs.

In another, not shown example, the first secondary arm 2241 includes another first secondary inner fin 2721 so that the two first secondary inner fins 2721 are distanced from each other.

In another, not shown example, the third secondary arm 2243 includes another third secondary inner fin 2723 so that the two third secondary inner fins 2723 are distanced from each other.

In another, not shown example, the second secondary arm 2242 includes a single second secondary inner fin 2722.

The first secondary inner fin 2721 and the second secondary inner fin 2722 can extend along the second tube extension axis X2 to define respectively a length L of the first secondary inner fin 2721 and a length L of the second secondary inner fin 2722. The third secondary inner fin 2723 can extend along the second tube extension axis X2 to define a length L of the third secondary inner fin 2723.

In general, lengths L of the parts/components of second tube 220 are measured parallel to the second tube extension axis X2.

The lengths L of the first secondary inner fin 2721, the second secondary inner fin 2722 and the third secondary inner fin 2723 can be preferably comprised between 50 and 200 mm.

In the shown example, the first secondary inner fin 2721 measures 160 mm, the two second secondary inner fins 2722 each measure 80 mm and the third secondary inner fin 2723 measures 160 mm.

The length L of the first secondary arm 2241 can be preferably comprised between 230 and 300 mm. In the shown example, the length L of the first secondary arm 2241 is 290 mm.

The length L of the second secondary arm 2242 can be preferably comprised between 230 and 300 mm. In the shown example, the length L of the second secondary arm 2142 is 290 mm.

The length L of the third secondary arm 2243 can be preferably comprised between 230 and 300 mm. In the shown example, the length L of the third secondary arm 2243 is 290 mm.

The length L of the first secondary wall 2253 can be preferably comprised between 240 and 290 mm. In the shown example, the length L of the first secondary wall 2253 is 270 mm.

The length L of the second secondary wall 2254 can be preferably comprised between 170 and 220 mm. In the shown example, the length L of the second secondary wall

2254 is 190 mm. This length is not taking account the first secondary guiding protrusion 2280 and the second guiding protrusion 2281.

The length L of the first secondary guiding protrusion 2280 can be preferably comprised between 5 and 12 mm. In the shown example, the length L of the first secondary guiding protrusion 2280 is 8 mm.

The length L of the second guiding protrusion 2281 can be preferably comprised between 6 and 14 mm. In the shown example, the length L of the second guiding protrusion 2281 is 10 mm.

Figure 37:
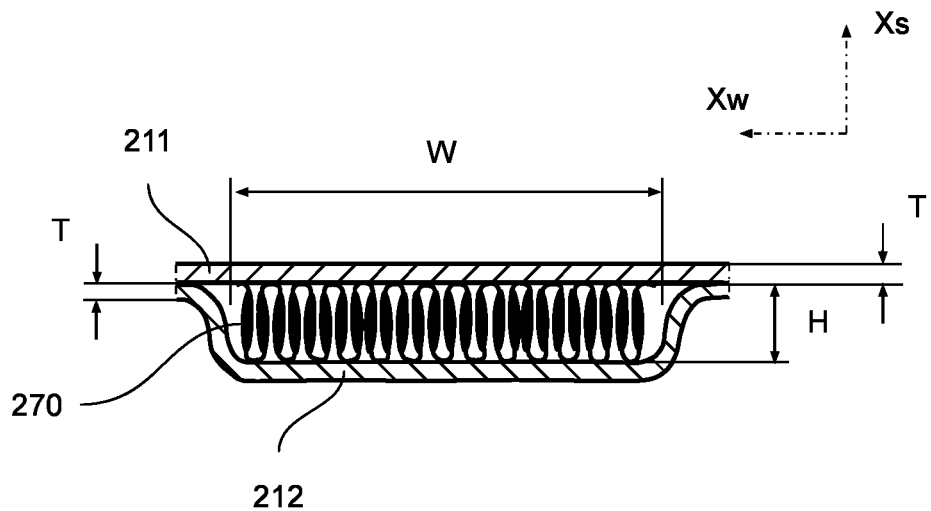
FIG. 37 shows schematically a cross-section of a fluid channel of one of the tubes.

FIG. 37 shows schematically a cross-section of the first primary arm 2141 of the first fluid channel 2103 of the first tube 210. It is however to be noted that the same notation of dimensioning indicated by means of FIG. 37 is applicable for any of the second primary arm 2142, third primary arm 2143, first secondary arm 2241, second secondary arm 2242 and third secondary arm 2243 in an analogous manner and their respective fins.

The first primary inner fin 2711, the second primary inner fin 2712 and the third primary inner fin 2713 can extend along a stamp axis Xs perpendicular to the first tube extension axis X1 to define respectively a height H of the first primary inner fin 2711 and a height H of the second primary inner fin 2712.

In general, heights H of the parts/components of first tube 210 are measured parallel to the stamp axis Xs.

The heights H of the first primary arm 2141, the second primary arm 2142 and of the third primary arm 2143 (i.e. of the area through which the fluid can flow through) can preferably be comprised between 2 and 6 mm.

In the shown example, the height H of the first primary arm 2141 is 6 mm.

In the shown example, the height H of the second primary arm 2142 is 6 mm.

In the shown example, the height H of the third primary arm 2143 is 6 mm.

The heights H of the first primary fin 2711, the second primary fin 2712 and of the third primary fin 2713 (i.e. of the area through which the fluid can flow through) can preferably be comprised between 2 and 5 mm.

In the shown example, the height H of the first primary fin 2711 is 6 mm.

In the shown example, the height H of the second primary fin 2712 is 6 mm.

In the shown example, the height H of the third primary fin 2713 is 6 mm.

In one example, the height of the first primary fin 2711, the second primary fin 2712 and the third primary fin 2713 is the same as heights H of the first primary arm 2141, the second primary arm 2142 and of the third primary arm 2143, respectively.

The first primary arm 2141 and the second primary arm 2142 can extend along a width extension axis Xw to define respectively a width W of the first primary arm 2141 and width W of the second primary arm 2142. Similarly, the third primary arm 2143 can extend along the width extension axis Xw to define a width W of the third primary arm 2143.

In general, widths W of the parts/components of first tube 210 are measured parallel to the width extension axis Xw.

The widths W of the first primary arm 2141, the second primary arm 2142 and the third primary arm 2143 can be comprised between 15 and 60 mm.

In the shown example, the width W of the first primary arm 2141 is 25 mm.

In the shown example, the width W of the second primary arm 2142 is 25 mm.

In the shown example, the width W of the third primary arm 2143 is 25 mm.

The first flat plate 211 and the first shaped plate 212 can each have a thickness T comprised between 0.6 and 2 mm. Thickness can be defined as material thickness of the first flat plate 211 and the first shaped plate 212 measured parallel to the stamp axis Xs.

The first secondary inner fin 2721, the second secondary inner fin 2722 and the third secondary inner fin 2723 can extend along a stamp axis Xs perpendicular to the second tube extension axis X2 to define respectively a height H of the first secondary inner fin 2721 and a height H of the second secondary inner fin 2722.

In general, heights H of the parts/components of second tube 220 are measured parallel to the stamp axis Xs.

The heights H of the first secondary arm 2241, the second secondary arm 2242 and of the third secondary arm 2243 (i.e. of the area through which the fluid can flow through) can preferably be comprised between 2 and 5 mm.

In the shown example, the height H of the first secondary arm 2241 is 6 mm.

In the shown example, the height H of the second secondary arm 2242 is 6 mm.

In the shown example, the height H of the third secondary arm 2243 is 6 mm.

The heights H of the first secondary fin 2721, the second secondary fin 2722 and of the third secondary fin 2723 (i.e. of the area through which the fluid can flow through) can preferably be comprised between 2 and 5 mm.

In the shown example, the height H of the first secondary fin 2721 is 6 mm.

In the shown example, the height H of the second secondary fin 2722 is 6 mm.

In the shown example, the height H of the third secondary fin 2723 is 6 mm.

In one example, the height of the first secondary fin 2721, the second secondary fin 2722 and the third secondary fin 2723 is the same as heights H of the first secondary arm 2241, the second secondary arm 2242 and of the third secondary arm 2243, respectively.

The first secondary arm 2241 and the second secondary arm 2242 can extend along a width extension axis Xw to define respectively a width W of the first secondary arm 2241 and width W of the second secondary arm 2242. Similarly, the third secondary arm 2243 can extend along the width extension axis Xw to define a width W of the third secondary arm 2243.

In general, widths W of the parts/components of second tube 220 are measured parallel to the width extension axis Xw.

The widths W of the first secondary arm 2241, the second secondary arm 2242 and the third secondary arm 2243 can be comprised between 15 and 60 mm.

In the shown example, the width W of the first secondary arm 2241 is 25 mm.

In the shown example, the width W of the second secondary arm 2242 is 25 mm.

In the shown example, the width W of the third secondary arm 2243 is 25 mm.

The second flat plate 221 and the second shaped plate 222 can each have a thickness T comprised between 0.6 and 2 mm. Thickness can be defined as material thickness of the second flat plate 221 and the second shaped plate 222 measured parallel to the stamp axis Xs.

Figure 38:
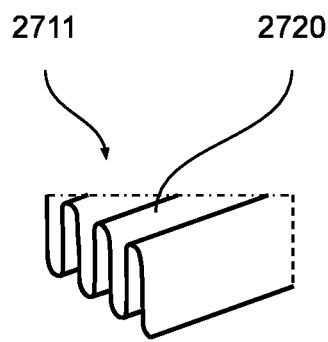
FIG. 38 shows a partial perspective view of one example of an inner fin.
Figure 39:
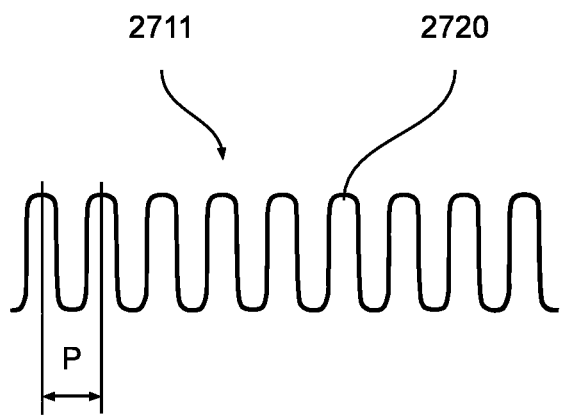
FIG. 39 shows a cross-section of the inner fin of FIG. 38.
Figure 40:
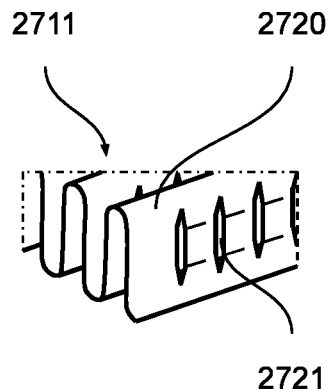
FIG. 40 shows a partial perspective view of another example of an inner fin.
Figure 41:
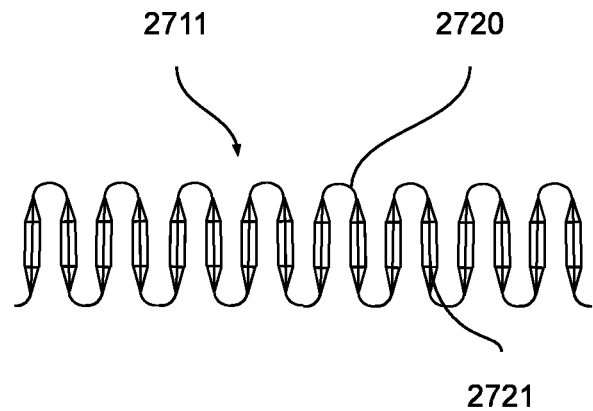
FIG. 41 shows a cross-section of the inner fin of FIG. 40.

FIGS. 38 and 40 show partial perspective views of examples of the first primary inner fin 2711, with FIGS. 39 and 41 showing respective cross-sections thereof. It is however to be noted that these figures are applicable for any of the second primary inner fin 2712, third primary inner fin 2713, first secondary inner fin 2721, second secondary inner fin 2722 and third secondary inner fin 2723.

The first primary inner fin 2711, the second primary inner fin 2712 and the third primary inner fin 2713 can be corrugated so that the corrugations 2720 extend parallel to the first tube extension axis X1. The pitch P thereof can be comprised between 0.9 and 3 mm. The pitch P is defined as the distance from the centerline of one corrugation 2720 to the centerline of the other, same side corrugation 2720 as shown in FIG. 39.

The first primary inner fin 2711, the second primary inner fin 2712 and the third primary inner fin 2713 can be corrugated so that the corrugations 2720 extend parallel to the first tube extension axis X1, and each can include a plurality of louvers 2721 arranged along the first tube extension axis X1. The louvers 2721 help induce turbulent flow through the corrugations 2720.

In one example, the first primary inner fin 2711 and the third primary inner fin 2713 are smooth, while the two second primary inner fins 2712 include louvers 2721.

The first secondary inner fin 2721, the second secondary inner fin 2722 and the third secondary inner fin 2723 can be corrugated so that the corrugations 2720 extend parallel to the second tube extension axis X2. The pitch P thereof can be comprised between 0.9 and 3 mm. The pitch P is defined as the distance from the centerline of one corrugation 2720 to the centerline of the other, same side corrugation 2720 as shown in FIG. 39.

The first secondary inner fin 2721, the second secondary inner fin 2722 and the third secondary inner fin 2723 can be corrugated so that the corrugations 2720 extend parallel to the second tube extension axis X2, and each can include a plurality of louvers 2721 arranged along the second tube extension axis X2. The louvers 2721 help induce turbulent flow through the corrugations 2720.

In one example, the first secondary inner fin 2721 and the third secondary inner fin 2723 are smooth, while the two second secondary inner fins 2722 include louvers 2721.

Figure 42:
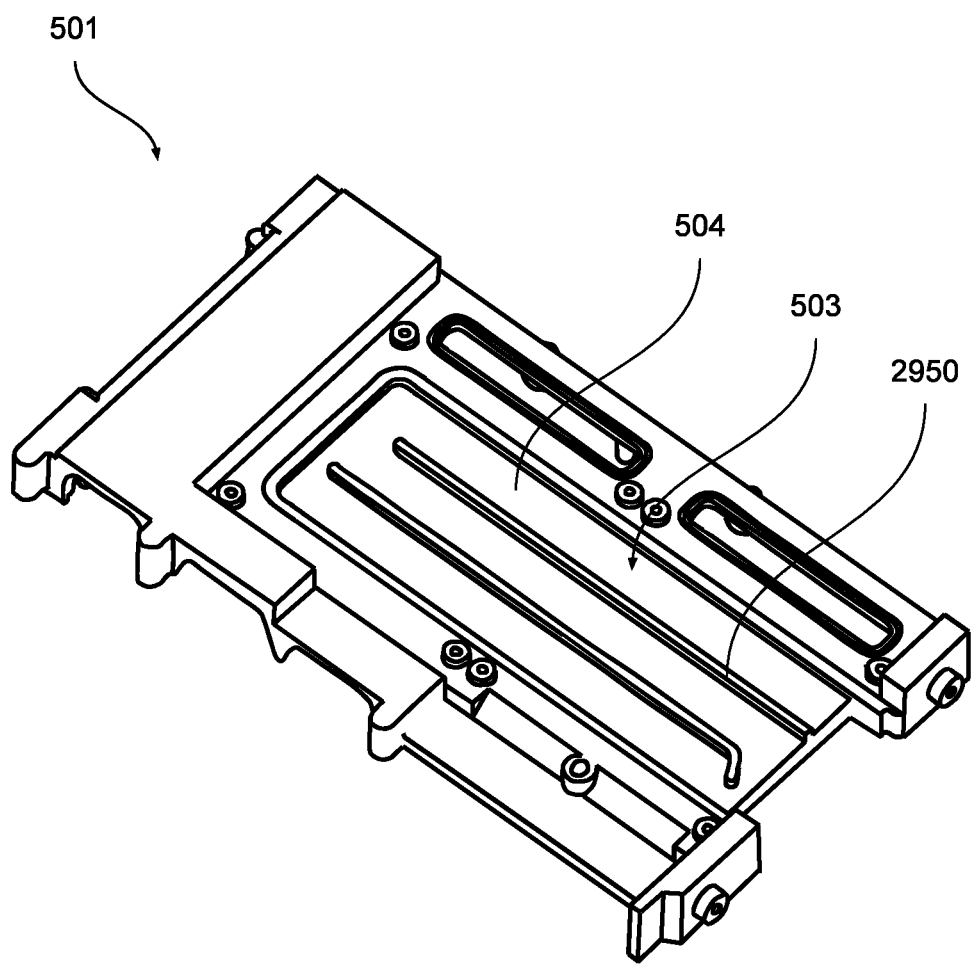
FIG. 42 shows another example of the housing.
Figure 43:
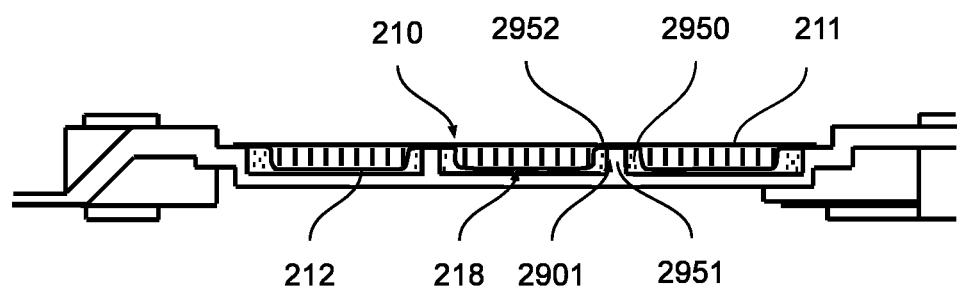
FIG. 43 shows a schematic cross-section of another example of the housing with a first tube.

FIG. 42 shows another example of the housing 501, with FIG. 43 showing a schematic cross-section of the housing 501 of FIG. 42 with a first tube 210.

In the example, the heat exchanger assembly 100 can include a heat exchanger 200 with a first tube 210. The first tube 210 can include a first flat plate 211 and a first shaped plate 212 connected to each other to form a first tube channel 2103 extending along a first tube extension axis X1. The first shaped plate 212 can include a stamped depression 218 forming together with the surface of the first flat plate 211 the first tube channel 2103. The heat exchanger assembly 100 can further include a chassis 500 to which the heat exchanger 200 is attached. The chassis 500 can include a housing 501, with the first tube 210 being located externally with respect to the housing 501. The housing 501 can have a primary slot 503 in which the first tube 210 is at least partially enveloped, with the first tube 210 facing the primary slot 503 with the first shaped plate 212. In other words, the first tube 210 is oriented so that the first shaped plate 212 faces the housing 501, while the first flat plate 211 faces away from the housing 501.

The first tube 210 can be connected to the primary slot 503 by an adhesive 2950.

In one example, the adhesive 2950 is adapted to have high temperature conductivity. Consequently, the first tube 210 can cool the housing 501 and/or any heat source housed by the housing 501.

In one example, the adhesive 2950 fills, in a binding manner, at least portion of space formed between the primary slot 503 and an unstamped portion 2952 of the first shaped plate 212.

In another example, the adhesive 2950 fills, in a binding manner, all the space formed between the primary slot 503 and an unstamped portion 2952 of the first shaped plate 212.

The stamped depression 218 can be at least partly in contact with the primary slot 503.

The stamped depression 218 can also be separated from the primary slot 503 by the adhesive 2950. In other words, the first tube 210 can remain at a distance with respect to the housing 501, with the adhesive 2950 providing an intermediate layer in contact with both of them, consequently providing connection and thermal contact.

The primary slot 503 can include a first rib 2951 protruding from the primary slot 503 towards the first tube 210 within the unstamped portion 2952 of the first shaped plate 212.

The primary slot 503 can include a primary separation wall 504, the primary separation wall 504 having an outline corresponding to an outline of the first tube 210.

The first rib 2951 can touch the first tube 210, in particular the first stamped plate 212.

The first rib 2951 can also be connected to the first tube 210, in particular the first stamped plate 212, by the adhesive 2950. In other words, the first rib 2951 can remain at a distance with respect to the first tube 210, with the adhesive 2950 providing an intermediate layer in contact with both of them, consequently providing connection and thermal contact. Presence of the first rib 2951 improves the rigidity of the whole assembly, in particular with the adhesive 2950 being able to penetrate part or the whole space between the elements.

The first tube channel 2103 can form a first primary arm 2141 and a second primary arm 2142 extending parallel to each other along the first tube extension axis X1, wherein the first primary arm 2141 is at least partly separated from the second primary arm 2142 by a first primary wall 2153, the first primary wall 2153 being an unstamped portion 2952 of the first shaped plate 212 between the first primary arm 2141 and the second primary arm 2142 and thereby creating a first primary spacing 2901.

The adhesive 2950 can fill the first primary spacing 2901.

Figure 44:
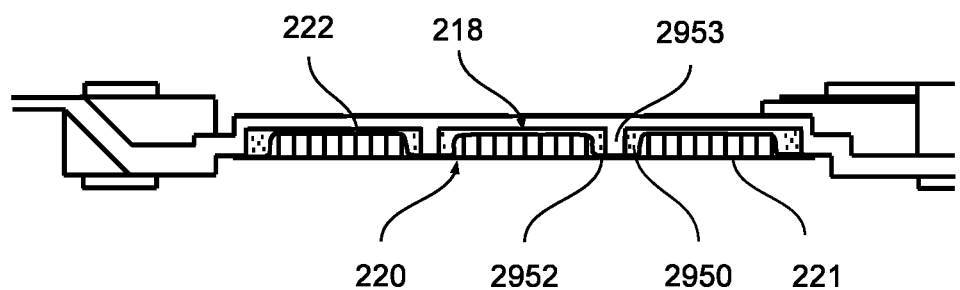
FIG. 44 shows a schematic cross-section of another example of the housing with a second tube.

FIG. 44 shows a schematic cross-section of another example of the housing 501 with a second tube 220. In this example, the bottom portion of the housing 501 is shown.

In this example, the heat exchanger 200 includes further a second tube 220 with a second flat plate 221 and a second shaped plate 222 connected to each other to form a second tube channel 2203 extending along a second tube extension axis X2.

The second shaped plate 222 can include another stamped depression 218 forming together with the surface of the second flat plate 221 the second tube channel 2203.

The second tube 220 can be located externally with respect to the housing 501 analogously to the first tube 210 shown in FIG. 43.

The housing can have a secondary slot 506 in which the second tube 220 is at least partially enveloped, with the second tube 220 facing the secondary slot 506 with the second shaped plate 222.

The second tube 220 can be connected to the secondary slot 506 by an adhesive 2950, in particular the same adhesive 2950 as the first tube 210.

The adhesive 2950 can fill, in a binding manner, at least portion of space formed between the secondary slot 506 and an unstamped portion 2952 of the second shaped plate 222.

The adhesive 2950 can also fill, in a binding manner, all the space formed between the secondary slot 506 and an unstamped portion 2952 of the second shaped plate 222.

The stamped depression 218 of the second tube 220 can be at least partly in contact with the secondary slot 506.

The stamped depression 218 of the second tube 220 can also be separated from the secondary slot 506 by the adhesive 2950.

The secondary slot 506 can include a second rib 2953 protruding from the secondary slot 506 towards the second tube 220 within the unstamped portion 2952 of the second shaped plate 222.

The second rib 2953 can touch, or be in direct contact with, the second tube 220 (the second stamped plate 222).

The second rib 2953 can be connected to the second tube 220 (the second stamped plate 222) by the adhesive 2950.

In general, the disclosure regarding the first tube 210 and the second tube 220 disclosed above in relation to FIGS. 1-43 is applicable to the example of FIG. 44 mutatis mutandis, e.g. their relationship with any heat sources present within the assembly 100.

Other variations to the disclosed embodiments can be understood and effected by those skilled in the art in practicing the claimed invention, from a study of drawings, the disclosure, and the appended claims. The mere fact that certain measures are recited in mutually different dependent claims does not indicate that a combination of these measures cannot be used to the advantage.

The invention claimed is:

1. A heat exchanger assembly comprising:
   a heat exchanger with
      a first tube including
         a first flat plate and a first shaped plate connected to each other to form a first tube channel extending along a first tube extension axis, with the first shaped plate including a stamped depression forming together with a surface of the first flat plate the first tube channel,
      a chassis to which the heat exchanger is attached, the chassis including a housing,
      wherein the first tube is located externally with respect to the housing,
      wherein the housing has a primary slot in which the first tube is at least partially enveloped, with the first tube facing the primary slot with the first shaped plate,
      wherein the first tube is connected to the primary slot by an adhesive.

2. The heat exchanger assembly according to claim 1, wherein the adhesive fills, in a binding manner, at least portion of space formed between the primary slot and an unstamped portion of the first shaped plate.

3. The heat exchanger assembly according to claim 1, wherein the adhesive fills, in a binding manner, all the space formed between the primary slot and an unstamped portion of the first shaped plate.

4. The heat exchanger according to claim 1, wherein the stamped depression is at least partly in contact with the primary slot.

5. The heat exchanger assembly according to claim 1, wherein the stamped depression is separated from the primary slot by the adhesive.

6. The heat exchanger assembly according to claim 1, wherein the primary slot includes a primary separation wall, the primary separation wall having an outline corresponding to an outline of the first tube.

7. The heat exchanger assembly according to claim 1, wherein the adhesive is adapted to have high temperature conductivity.

8. The heat exchanger assembly according to claim 1, wherein the heat exchanger includes a second tube including
      a second flat plate and a second shaped plate connected to each other to form a second tube channel extending along a second tube extension axis,
      wherein the second shaped plate includes another stamped depression forming together with a surface of the second flat plate the second tube channel,
   wherein the second tube is located externally with respect to the housing,
   wherein the housing has a secondary slot in which the second tube is at least partially enveloped, with the second tube facing the secondary slot with the second shaped plate,
   wherein the second tube is connected to the secondary slot by an adhesive.

9. The heat exchanger assembly according to claim 1, wherein the adhesive fills, in a binding manner, at least portion of space formed between the secondary slot and an unstamped portion of the second shaped plate.

10. The heat exchanger assembly according to claim 1, wherein the adhesive fills, in a binding manner, all the space formed between the secondary slot and an unstamped portion of the second shaped plate.

11. The heat exchanger according to claim 1, wherein the stamped depression of the second tube is at least partly in contact with the secondary slot.

12. The heat exchanger assembly according to claim 1, wherein the stamped depression of the second tube is separated from the secondary slot by the adhesive.

13. The heat exchanger assembly according to claim 1, wherein the primary slot includes a first rib protruding from the primary slot towards the first tube within an unstamped portion of the first shaped plate.

14. The heat exchanger assembly according to claim 13, wherein the first rib touches the first tube.

15. The heat exchanger assembly according to claim 13, wherein the first rib is connected to the primary slot by the adhesive.

16. The heat exchanger assembly according to claim 1, wherein the first tube channel forms a first primary arm and a second primary arm extending parallel to each other along the first tube extension axis, wherein the first primary arm is at least partly separated from the second primary arm by a first primary wall, the first primary wall being an unstamped portion of the first shaped plate between the first primary arm and the second primary arm and thereby creating a first primary spacing.

17. The heat exchanger assembly according to claim 16, wherein the adhesive fills the first primary spacing.

18. The heat exchanger assembly according to claim 1, wherein the secondary slot includes a second rib protruding from the secondary slot towards the second tube within the unstamped portion of the second shaped plate.

19. The heat exchanger assembly according to claim 18, wherein the second rib touches the second tube.

20. The heat exchanger assembly according to claim 18, wherein the second rib is connected to the second tube by the adhesive.

* * * * *